US009595333B2

United States Patent
Sim et al.

(10) Patent No.: US 9,595,333 B2
(45) Date of Patent: Mar. 14, 2017

(54) NONVOLATILE MEMORY DEVICE AND PROGRAMMING METHOD THEREOF

(71) Applicants: Jaesung Sim, Hwaseong-si (KR); Youngwoo Park, Seoul (KR)

(72) Inventors: Jaesung Sim, Hwaseong-si (KR); Youngwoo Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/702,895

(22) Filed: May 4, 2015

(65) Prior Publication Data

US 2016/0027514 A1 Jan. 28, 2016

(30) Foreign Application Priority Data

Jul. 22, 2014 (KR) ........................ 10-2014-0092782

(51) Int. Cl.
*G11C 11/34* (2006.01)
*G11C 16/10* (2006.01)
(Continued)

(52) U.S. Cl.
CPC .......... *G11C 16/10* (2013.01); *G11C 11/5628* (2013.01); *G11C 16/24* (2013.01); *G11C 16/0483* (2013.01)

(58) Field of Classification Search
CPC .... G11C 16/0483; G11C 16/18; H01L 27/115
(Continued)

(56) References Cited

U.S. PATENT DOCUMENTS 7,095,656 B2 8/2006 Lee
7,169,671 B2 1/2007 Ono
(Continued)

FOREIGN PATENT DOCUMENTS

JP 3073725 B2 8/2000
JP 2006024680 A 1/2006
(Continued)

OTHER PUBLICATIONS

Won-seok et al., "Highly Reliable Vertical NAND Technology with Biconcave Shapedn Storage Layer and Leakage Controllable Offset Structure", 2010 Symposium on VLSI Technology Digest of Technical Papers, pp. 173-174.

*Primary Examiner* — Son Dinh
(74) *Attorney, Agent, or Firm* — Harness, Dickey & Pierce, P.L.C.

(57) ABSTRACT

According to example embodiments, a nonvolatile memory device includes a plurality of cell strings on a horizontal semiconductor layer. Each of the cell strings including a plurality of memory cells stacked in a direction perpendicular to the horizontal semiconductor layer. According to example embodiments, a programming method of the nonvolatile memory device includes setting up bitlines corresponding the cell strings, setting up a plurality of string select lines connected to the cell strings, and applying a negative voltage lower to a ground select line. The ground select line is connected to a plurality of ground select transistors between the memory cells and the semiconductor layer. The string select lines extend in a direction intersecting the bitlines. The negative voltage is lower than a ground voltage.

23 Claims, 23 Drawing Sheets

(51) Int. Cl.
*G11C 11/56* (2006.01)
*G11C 16/24* (2006.01)
*G11C 16/04* (2006.01)

(58) Field of Classification Search
USPC .................................... 365/185.17, 185.18
See application file for complete search history.

(56) References Cited

U.S. PATENT DOCUMENTS

| | | |
|---|---|---|
| 7,554,862 B2 | 6/2009 | Shibata |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 2005/0185471 A1 | 8/2005 | Lee |
| 2006/0008982 A1 | 1/2006 | Ono |
| 2007/0147141 A1 | 6/2007 | Shibata |
| 2009/0121271 A1 | 5/2009 | Son et al. |
| 2011/0216603 A1 | 9/2011 | Han et al. |
| 2011/0233648 A1 | 9/2011 | Seol et al. |
| 2012/0051137 A1* | 3/2012 | Hung .................. G11C 16/0466 365/185.17 |
| 2012/0051143 A1 | 3/2012 | Yoon et al. |
| 2013/0121071 A1 | 5/2013 | Sarin |
| 2013/0242675 A1 | 9/2013 | Kwak et al. |
| 2013/0279262 A1 | 10/2013 | Yoon et al. |
| 2014/0043896 A1 | 2/2014 | Park et al. |
| 2014/0192594 A1* | 7/2014 | Lue ....................... G11C 16/10 365/185.11 |

FOREIGN PATENT DOCUMENTS

| | | |
|---|---|---|
| KR | 100559715 B1 | 3/2006 |
| KR | 20080045050 A | 5/2008 |
| KR | 100858178 B1 | 9/2008 |
| KR | 101212709 B2 | 12/2012 |
| KR | 20130104590 A | 9/2013 |
| KR | 20140020135 A | 2/2014 |

\* cited by examiner

NONVOLATILE MEMORY DEVICE AND PROGRAMMING METHOD THEREOF

CROSS-REFERENCE TO RELATED APPLICATIONS

This U.S. non-provisional patent application claims priority under 35 USC §119 to Korean Patent Application No. 10-2014-0092782, filed on Jul. 22, 2014, the disclosure of which is incorporated by reference in its entirety herein.

BACKGROUND

Technical Field

Example embodiments relate to semiconductor memories and, more particularly, to nonvolatile memory devices and programming methods thereof.

Discussion of Related Art

Semiconductor memory device are memory devices implemented using a semiconductor such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Nonvolatile memory devices may include a static RAM (SRAM), a dynamic RAM (DRAM), and a synchronous DRAM (SDRAM). Nonvolatile memory devices retain their stored data even when their power supplies are interrupted. Nonvolatile memory devices may include a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), and a ferroelectric RAM (FRAM). Flash memory devices may be classified into NOR-type flash memory devices and NAND-type flash memory devices.

In recent years, a semiconductor memory device having a three-dimensional array structure has been studied to increase the integration density of the semiconductor memory device. In a three-dimensional array structure, vertical memory cell strings are connected to a substrate. Vertical memory cell strings may be connected to a common source line through the substrate. During a program operation, leakage current may be generated at a common source line junction. Due to the leakage current, an abnormal disturbance may occur between the vertical memory cell strings.

SUMMARY

The present disclosure relates to a nonvolatile memory devices and programming methods thereof.

According to example embodiments, a programming method of a nonvolatile memory device including a plurality of cell strings on a horizontal semiconductor layer is provided. Each of the cells strings includes a plurality of memory cells stacked in a direction perpendicular to the horizontal semiconductor layer. The programming method may include: setting up bitlines corresponding to the cell strings; setting up a plurality of string select lines connected to the cell strings, the string select lines extending in a direction intersecting the bitlines; and applying a negative voltage to a ground select line connected to a plurality of ground select transistors. The negative voltage is lower than a ground voltage. The ground select transistor is between the memory cells and the horizontal semiconductor layer.

In example embodiments, the programming method may further include applying the ground voltage to a common source line. The common source line may be connected to a doped region in the horizontal semiconductor layer. The doped region may extend in a direction parallel to the string select lines.

In example embodiments, an absolute value of the negative voltage may be controlled to be equal to an absolute value of a power supply voltage.

In example embodiments, the setting up a plurality of string select lines may include applying the power supply voltage to a selected one of the string select lines; and applying the negative voltage to an unselected one of the string select lines.

In example embodiments, the programming method may further include applying a source line voltage to a common source line. The common source line may be connected to a doped region in the horizontal semiconductor layer. The doped region may extend in a direction parallel to the string select lines.

In example embodiments, the source line voltage may be higher than the ground voltage and lower than a power supply voltage.

In example embodiments, an absolute value of the negative voltage may be controlled to be smaller than an absolute value of the power supply voltage.

In example embodiments, the setting up a plurality of string select lines may include applying the power supply voltage to a selected one of the string select lines; and applying the negative voltage to an unselected one of the string select lines.

In example embodiments, the programming method may further include applying a pass voltage to a plurality of wordlines connected to the memory cells; and applying a program voltage to a selected one of the wordlines after applying the pass voltage.

In example embodiments, the setting up bitlines may include applying the ground voltage to a selected one of the bitlines; and applying a power supply voltage to an unselected one of the bitlines.

According to example embodiments of inventive concepts, a nonvolatile memory device may include: a memory cell array including a plurality of cell strings on a substrate, each of the cell strings including a plurality of memory cells stacked in a direction perpendicular to the substrate, a ground select transistor between the memory cells and the substrate, and a string select transistor between the memory cells and a bitline; an address decoder; and a control logic. The address decoder is connected to the plurality of memory cells of the cell strings through wordlines. The address decoder is connected to the string select transistors of the cell strings through string select lines. The address decoder is connected to ground select transistors of the cell strings through a ground select line. The control logic is configured to control the address decoder to apply a negative voltage to the ground select line during a program operation. The negative voltage is lower than a ground voltage.

In example embodiments, the control logic may be configured to control the address decoder to apply the ground voltage to a common source line during the program operation. The common source line may be connected to a doped region in the substrate. The doped region may extend in a direction parallel to the string select line.

In example embodiments, the control logic may be configured to control the address decoder to apply a source line voltage is applied to a common source line during the program operation. The common source line may be connected to a doped region in the substrate. The doped region may extend in a direction parallel to the string select line during the program operation.

In example embodiments, the source line voltage may be controlled to be higher than the ground voltage and lower than a power supply voltage.

In example embodiments, the nonvolatile memory device may further include a voltage generator connected to the address decoder. The voltage generator may be configured to generate a first negative voltage or a second negative voltage. An absolute value of the first negative voltage may be the same as an absolute value of a power supply voltage. An absolute value of the second negative voltage may be less than the absolute value of the power supply voltage.

In example embodiments, the control logic may be configured to control the address decoder to apply the first negative voltage an unselected one of the string select lines during the program operation when the first negative voltage is applied to the ground select line.

In example embodiments, the control logic may be configured to control the address decoder to apply the second negative voltage to an unselected one of the string select lines during the program operation when the second negative voltage is applied to the ground select line.

Example embodiments of inventive concepts also relate to a nonvolatile memory device. The nonvolatile memory device may include a memory cell array including a plurality of cell string each including a plurality of memory cells stacked in a direction perpendicular to a horizontal semiconductor layer, a ground select transistor provided between the memory cells and the horizontal semiconductor layer, and a string select transistor provided between the memory cells and a bitline; an address decoder connected to ground select transistors of the cell strings through a ground select line; and a control logic configured to control the address decoder such that a negative voltage lower than a ground voltage is applied to the ground select line during a program operation. The address decoder and the control logic may be disposed between the horizontal semiconductor layer and a substrate.

In example embodiments, the control logic may control the address decoder such that the ground voltage or a source line voltage is applied to a common source line connected to a doped region formed on the horizontal semiconductor layer in a direction parallel to the string select lines during the program operation.

In example embodiments, the source line voltage may be controlled to be higher than the ground voltage and lower than a power supply voltage.

According to example embodiments of inventive concepts, a programming method of a nonvolatile memory device including a plurality of cell strings on a substrate is provided. Each of the cell strings includes a plurality of memory cells. The programming method includes: setting up a bit line connected to a selected cell string and an unselected cell string among the plurality of cell strings; setting up a selected string select line and an unselected string select line; and applying a negative voltage to a ground select line connected to the selected cell string and the unselected cell string. The negative voltage is lower than a ground voltage. The selected string select line is connected to the selected cell string. The unselected cell string is connected to the unselected cell strings.

In example embodiments, the nonvolatile memory device may include a plurality of word lines and a common source line connected to the cell strings. The plurality of memory cells in each of the cell strings may be stacked on top of each other between a ground select transistor and a string select transistor. The string select transistors of the cell strings may be on top of the plurality of memory cells of the cell strings.

In example embodiments, the programming method may further include applying the ground voltage to the common source line, applying a pass voltage to unselected word line among the plurality of word lines, and applying a program voltage to a selected word line among the plurality of word lines.

In example embodiments, the programming method may further include applying a power supply voltage to an unselected bit line when the setting up the bit line is performed. The unselected bit line may be connected to other cell strings among the plurality of cell strings. The setting up the bit line connected to the selected cell string and the unselected cell string may include applying the ground voltage to the selected bit line. The power supply voltage and the negative voltage may be opposite in sign.

In example embodiments, the setting up the selected string select line and the unselected string select line may include applying a power supply voltage to the selected string select line and applying a voltage less than or equal to the ground voltage to the unselected string select line. The power supply voltage and the negative voltage are opposite in sign.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
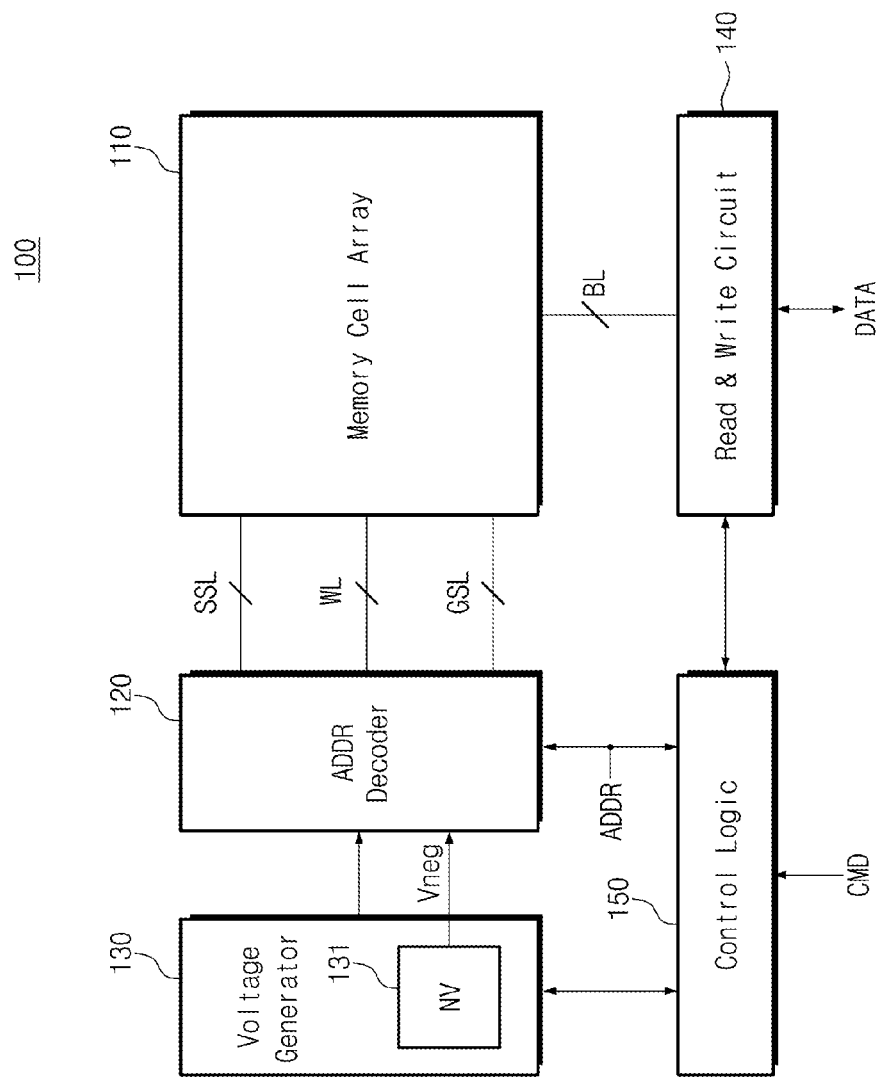
FIG. 1 is a block diagram of a nonvolatile memory device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram of a nonvolatile memory device 100 according to example embodiments of inventive concepts. As illustrated, the nonvolatile memory device 100 may include a memory cell array 110, an address decoder 120, a voltage generator 130, a read/write circuit 140, and a control logic 150.

The memory cell array 110 is connected to the address decoder 120. The memory cell array 110 is connected to the read/write circuit 140 through bitlines BL. The memory cell array 110 includes a plurality of memory cells, which are stacked on a substrate. In example embodiments, a plurality of memory cells may store one or more bits per cell.

The address decoder 120 is connected to the memory cell array 110 through a plurality of lines (e.g., string select lines SSL, wordlines WL, and ground select lines GSL). The ground select line GSL may be provided in singularity or plurality. The address decoder 120 is connected to the voltage generator 130. The address decoder 120 is configured to operate in response to the control of the control logic 150.

The address decoder 120 externally receives an address ADDR. The address decoder 120 may decode a row address among the address ADDR. The address decoder 120 may select a wordline corresponding to the decoded row address. According to the decoded row address, the address decoder 120 may apply voltages supplied from the voltage generator 130 to a plurality of lines to select a wordline corresponding to the address ADDR.

The address decoder 120 is configured to decode a column address among the received address ADDR. The address decoder 120 transmits the decoded column address to the read/write circuit 140. In example embodiments, the address decoder 120 may include a row decoder to decode a row address, a column decoder to decode a column address, and an address buffer to store an address ADDR.

The address decoder 120 may receive a negative voltage Vneg from the voltage generator 130. During a program operation, the address decoder 120 may apply the negative voltage Vneg to a ground select line GSL or a string select line SSL.

The voltage generator 130 may be connected to the control logic 150 and the address decoder 120. The voltage generator 130 may operate according to the control of the control logic 150. The voltage generator 130 may be configured to generate various voltages. In example embodiments, voltages generated by the voltage generator 130 may be transferred to a plurality of lines connected to the memory cell array 110 through the address decoder 120. The voltage generator 130 may include a negative voltage generation circuit NV. The negative voltage generation circuit NV may generate a negative voltage Vneg to be supplied to the ground select line GSL during a program operation.

The read/write circuit 140 is connected to the memory cell array 110 through bitlines BL. The read/write circuit 140 operates in response to the control of the control logic 150. The read/write circuit 140 receives a decoded column address from the address decoder 120. The read/write circuit 140 may select bitlines BL using the decoded column address.

In example embodiments, during a program operation, the read/write circuit 140 may externally receive data DATA and program the received data into the memory cell array 110. During a read operation, the read/write circuit 140 may read the data DATA from the memory cell array 110 and transmit the read data DATA to an external entity.

In example embodiments, the read/write circuit 140 may include components such as a page buffer (or page register) and a column selection circuit. In example embodiments, the read/write circuit 140 may include components such as a sense amplifier, a write driver, and a column selection circuit.

The control logic 150 is connected to the address decoder 120, the voltage generator 130, and the read/write circuit 140. The control logic 150 is configured to control the overall operation of the nonvolatile memory device 100. The control logic 150 operates in response to a command CMD that is externally transmitted.

During a program operation, the control logic 150 may control the address decoder 120 to apply a ground voltage Vss to a common source line CSL. For example, the ground voltage Vss may be 0 volt. The control logic 150 may control the address decoder 120 to apply a negative voltage Vneg to a selected string select line SSL or a selected ground select line GSL. For example, the negative voltage may have a level lower than the ground voltage Vss. In example embodiments, the negative voltage Vneg may be −1 volt or −2 volt. However, the negative voltage Vneg is not limited thereto.

Figure 2:
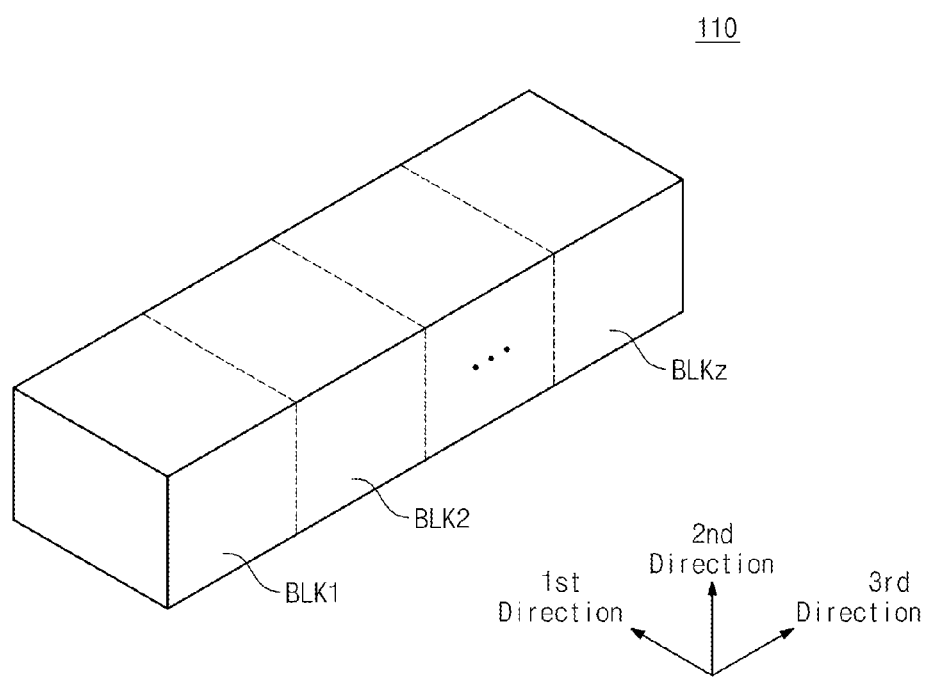
FIG. 2 is a block diagram of a memory cell array in FIG. 1.

FIG. 2 is a block diagram of the memory cell array in FIG. 1. Referring to FIG. 2, the memory cell array 110 includes a plurality of memory blocks BLK1 to BLKz. Each of the memory blocks BLK1 to BLKz has a three-dimensional structure. For example, each of the memory blocks BLK1 to BLKz may include structures extending in first to third directions. Each of the memory blocks BLK1 to BLKz may include a plurality of NAND strings NS extending in the second direction. A plurality of NAND strings NS may be provided in the first and third directions.

Each of the memory blocks BLK1 to BLKz is connected to a plurality of bitlines BL, a plurality of string select lines SSL, a plurality of ground select lines GSL, a plurality of wordlines WL, and a common source line CSL. Each of the NAND strings NS may be connected to a bitline BL, a string select line SSL, a ground select line GSL, wordlines WL, and a common source line CSL.

The memory blocks BLK1 to BLKz may be selected by the address decoder 120 shown in FIG. 1. For example, the address decoder 120 is configured to select a memory block BLK corresponding to a decoded row address among the memory blocks BLK1 to BLKz.

Figure 3:
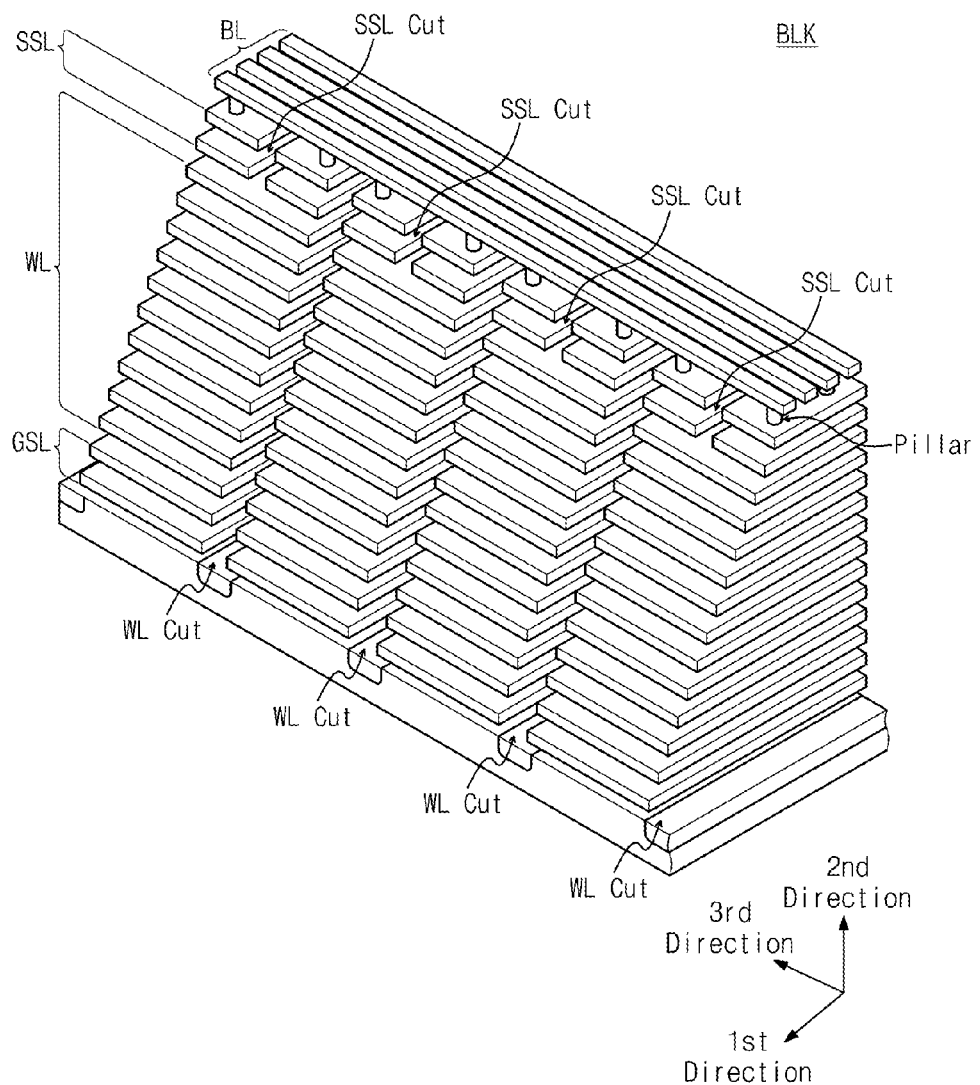
FIG. 3 illustrates a memory block among memory blocks in FIG. 2.

FIG. 3 illustrates a memory block BLK among memory blocks in FIG. 2. Referring to FIG. 3, four sub-blocks may be formed on a substrate SUB. Each of the sub-blocks may be formed by stacking at least one ground select line GSL, a plurality of wordlines WL, and at least one string select line SSL between wordline cuts on the substrate SUB. The at least one string select line SSL may be separated by a string select line cut.

For example, at least one dummy wordline may be stacked in the form of a plate between the ground select line GSL and the wordlines WL or at least one dummy wordline may be stacked in the form of a plate between the wordlines WL and the string select line SSL.

Although not shown, each of the wordline cuts may include a common source line SSL. For example, a common source line included in each of the wordline cuts may be commonly connected. A pillar connected to a bitline may penetrate at least one ground select line GSL, a plurality of wordlines WL, and at least one string select line SSL to form a string.

In FIG. 3, a target between wordline cuts is a sub-block. However, example embodiments of inventive concepts are not limited thereto. According to example embodiments of inventive concepts, a target between a wordline cut and a string select line cut may be named a sub-block.

A memory block BLK according to example embodiments of inventive concepts may be implemented using a structure in which two wordlines are merged, e.g., a wordline merged structure.

Figure 4:
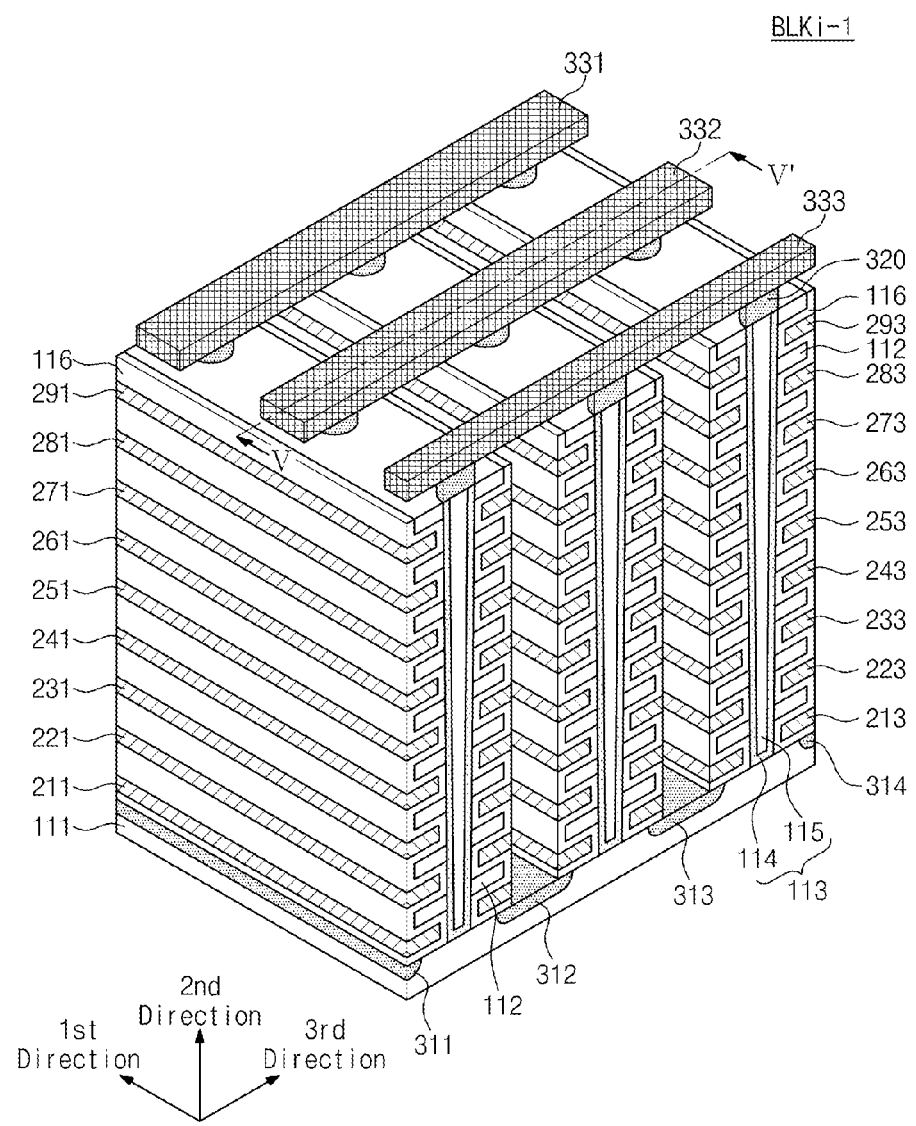
FIG. 4 is a perspective view illustrating one of the memory blocks in FIG. 2.
Figure 5:
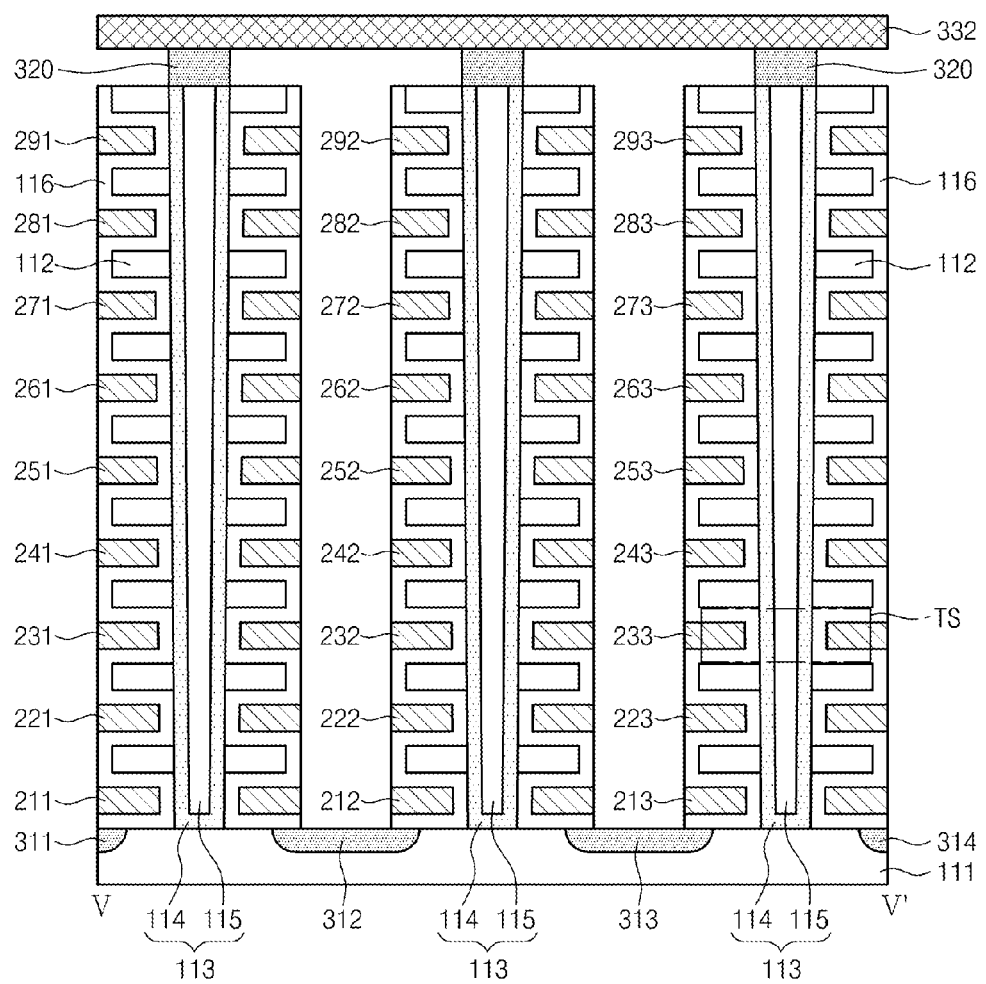
FIG. 5 is a cross-sectional view taken along a line V-V' of the memory block in FIG. 4.

FIG. 4 is a perspective view illustrating one block BLKi-1 among the memory blocks BLK1 to BLKz in FIG. 2. FIG. 5 is a cross-sectional view taken along a line V-V' of the memory block BLKi-1 in FIG. 4. Referring to FIGS. 4 and 5, the memory block BLKi-1 may include structures extending in first to third directions.

A substrate 111 is provided. In example embodiments, the substrate 111 may be a first-type well (e.g., well having a first conductivity type). For example, the substrate 111 may be a p-well formed by injecting a 3B-group element such as boron (B). For example, the substrate 111 may be a pocket p-well provided in an n-well. Hereinafter, let it be assumed that the substrate 111 may be a p-type well (or p-type pocket well). However, a conductivity type of the substrate 111 is not limited to p-type.

A plurality of doped regions 311-314 extending in the first direction are provided on the substrate 111. For example, the doped regions 311-314 may have a second type (e.g., second conductivity type) different from that of the substrate 111. For example, the doped regions 311-314 may have an n-type. Hereinafter, let it be assumed that the doped regions 311-314 may have an n-type. However, the conductivity type of the doped regions 311-314 is not limited to the n-type.

On a region of the substrate 111 between the first and second doped regions 311 and 312, a plurality of insulating materials 112 extending in the first direction are sequentially provided in the second direction. For example, the insulating materials 112 are provided in the second direction to be spaced apart from each other at specific intervals. The insulating materials 112 may include an insulating material such as silicon oxide.

On the region of the substrate 111 between the first and second doped regions 311 and 312, a plurality of pillars 113 are provided which are sequentially disposed in the first direction and penetrate the insulating materials 112. In example embodiments, the pillars 113 may be in contact with the substrate 111 through the insulating materials 112.

In example embodiments, each of the pillars 113 may include a plurality of materials. For example, a surface layer 114 of each of the pillars 113 may include a silicon material having a first type. For example, a surface layer 114 of each of the pillars 113 may include a silicon material having the same type as the substrate 111. Hereinafter, let it be assumed that a surface layer 111 of each of the pillars 113 includes p-type silicon. However, the surface 114 of each of the pillars 113 is not limited to the inclusion of p-type silicon.

An inner layer 115 of each of the pillars 113 may include an insulating material. For example, the inner layer 115 of each of the pillars 113 may include an insulating material such as silicon oxide. For example, the inner layer 115 of each of the pillars 113 may include an air gap.

In the region between the first and second doped regions 311 and 312, an insulating layer 116 is provided along exposed surfaces of the insulating materials 112, the pillars 113, and the substrate 111. In example embodiments, an insulating layer 116 provided on an exposed surface in the second direction of the last insulating material 112 may be removed in the second direction.

In example embodiments, thickness of the insulating layer 116 may be smaller than half a distance between the insulating materials 112. That is, a region in which other than the insulating materials 112 and the insulating layer 116, another material may be disposed may be provided between the insulating layer 116 provided on a bottom surface of the first insulating material 112 and a top surface of the second insulating material among the insulating materials 112.

In the region between the first and second doped regions 311 and 312, first conductive materials 211-291 are provided on an exposed surface of the insulating layer 116. For example, a first conductive material 211 extending in the first direction is provided between the substrate 111 and the insulating material 112 adjacent to the substrate 111. More specifically, a first conductive material 211 extending in the first direction is provided between the substrate 111 and an insulating layer 116 on a bottom surface of the insulating material 112 adjacent to the substrate 111.

A first conductive material 291 extending in the first direction is provided between an insulating layer 116 of a specific material top surface among the insulating materials 112 and an insulating layer 116 of a bottom surface of an insulating layer disposed above a specific insulating material. In example embodiments, a plurality of first conductive materials 211-291 may be metal materials. In example embodiments, the first conductive materials 211-291 may be conductive materials such as polysilicon.

The same structure as that on the first and second doped regions 311 and 312 may be provided in a region between the second and third doped regions 312 and 313. In addition, the same structure as that on the first and second doped regions 311 and 312 may be provided in a region between the third and fourth doped regions 313 and 314.

Drains 320 are provided on the pillars 113, respectively. In example embodiments, the drains 320 may include silicon materials doped with second-type impurities. For example, the drains 320 may include silicon materials doped with n-type impurities. Hereinafter, let it be assumed that the drains 320 may include n-type silicon materials. However, the drains 320 are not limited to the inclusion of the n-type materials.

In example embodiments, width of each of the drains 320 may be greater than that of a corresponding pillar 113. For example, each of the drains 320 may be provided on a top surface of a corresponding pillar 113 in the form of a pad. In example embodiments, each of the drains 320 may extend to a portion of a corresponding surface layer 114 of the corresponding pillar 113.

Conductive materials 331-333 extending in a third direction are provided on the drains 320. The conductive materials 331-333 are disposed in the first direction to be spaced apart from each other at specific intervals. The conductive materials 331 to 333 are connected to the drains 320 in a corresponding region, respectively. In example embodiments, the drains 320 and the conductive material 333 extending in the third direction are connected through contact plugs, respectively. In example embodiments, the conductive materials 331-333 may metal materials. The conductive materials 331-333 may be conductive materials such as polysilicon.

In FIGS. 4 and 5, each pillar 130 may constitute a string together with the insulating layer 116 and the first conductive materials 211 to 291, 212 to 292, and 213 to 293. For example, each pillar 113 may constitute a NAND string NS together with an adjacent region of the insulating layer 116 and an adjacent region among the first conductive materials 211 to 291, 212 to 292, and 213 to 293. The NAND string NS may include a plurality of transistor structures TS. The transistor structure TS will be described later with reference to FIG. 6.

Figure 6:
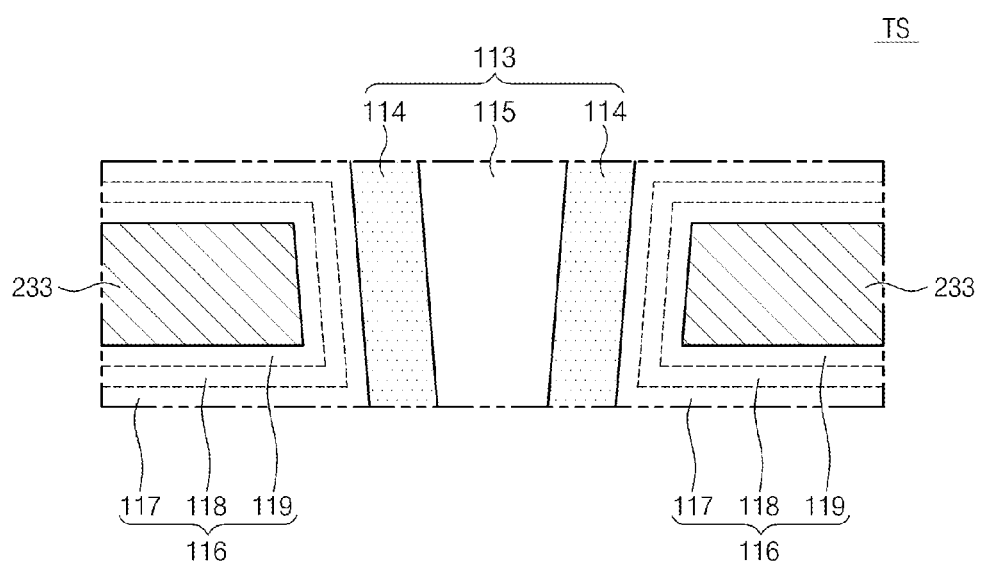
FIG. 6 is a cross-sectional view of a transistor structure in FIG. 5.

FIG. 6 is a cross-sectional view of a transistor structure in FIG. 5. Referring to FIGS. 4 to 6, the insulating layer 116 includes first to third sub-insulating layers 117, 118, and 119.

P-type silicon 114 of the pillar 113 may act as a body. A first sub-insulating layer 117 adjacent to the pillar 113 may act as a tunneling insulating layer. For example, the first sub-insulating layer 117 adjacent to the pillar 113 may include thermal oxide.

A second sub-insulating layer 118 may act as a charge storage layer. For example, the second sub-insulating layer 118 may act as a charge trap layer. For example, the second sub-insulating layer 118 may include nitride or metal oxide (e.g., aluminum oxide, hafnium oxide, etc.).

A third sub-insulating layer 119 adjacent to the conductive material 233 may act as a blocking insulating layer. For example, the third sub-insulating layer 119 adjacent to the conductive material 233 extending in the first direction may include a single layer or multiple layers. The third sub-insulating layer 119 may be a high-k dielectric layer (e.g., an aluminum oxide layer, a hafnium oxide layer, etc.) having a higher dielectric constant than the first and second sub-insulating layers 117 and 118.

The first conductive material 233 may act as a gate (or control gate). That is, the gate (or control gate) 233 acting as a control (or control gate), the blocking insulating layer 119 acting as a blocking insulating layer, the charge storage layer 118 acting as a charge storage layer, the tunneling insulating layer 117 acting as a tunneling insulating layer, and a surface layer 114 including p-type silicon and acting as a body may constitute a transistor (or memory cell transistor structure). For example, the first to third sub-insulating layers 117 to 119 may constitute oxide-nitride-oxide (ONO) (e.g., silicon oxide-silicon nitride-silicon oxide). Hereinafter, the surface layer 114 including the p-type silicon of the pillar 113 will be defined to act as a second-direction body.

In the memory block BLKi-1, a single pillar corresponds to a single NAND string NS. The memory block BLKi-1 may include a plurality of pillars 113. That is, the memory block BLKi-1 includes a plurality of NAND strings NS. More specifically, the memory block BLKi-1 includes a plurality of NAND strings NS extending in the second direction (or a direction perpendicular to a substrate).

Each of the NAND strings NS includes a plurality of transistor structures TS disposed in the second direction. At least one of the transistor structures TS acts as a string select transistor SST. At least one of the transistor structures TS acts as a ground select transistor GST.

The gates (or control gates) correspond to conductive materials 211 to 291, 212 to 292, and 213 to 293 extending in the first direction. That is, the gates (or control gates) extend in the first direction to form wordlines and at least two select lines SL (e.g., at least one string select line SSL and at least one ground select line GSL).

The conductive materials 331 to 333 extending in the third direction are connected to one end of NAND strings NS. In example embodiments, the conductive materials 331 to 333 extending in the third direction act as bitlines BL. That is, in a single memory block BLKi-1, a plurality of NAND strings are connected to a single bitline BL.

Second-type doped regions 311 to 314 extending in the first direction may be provided to the other end of NAND strings. The second-type doped regions 311 to 314 extending in the first direction may act as common source lines CSL.

As shown in FIGS. 4 to 6, the more the pillar 113 is close to the substrate 111, the smaller a sectional area of the pillar 113 is in the first and third directions. For example, the sectional area of the pillar 113 in the first to third directions may vary depending on a process characteristic or error.

Figure 7:
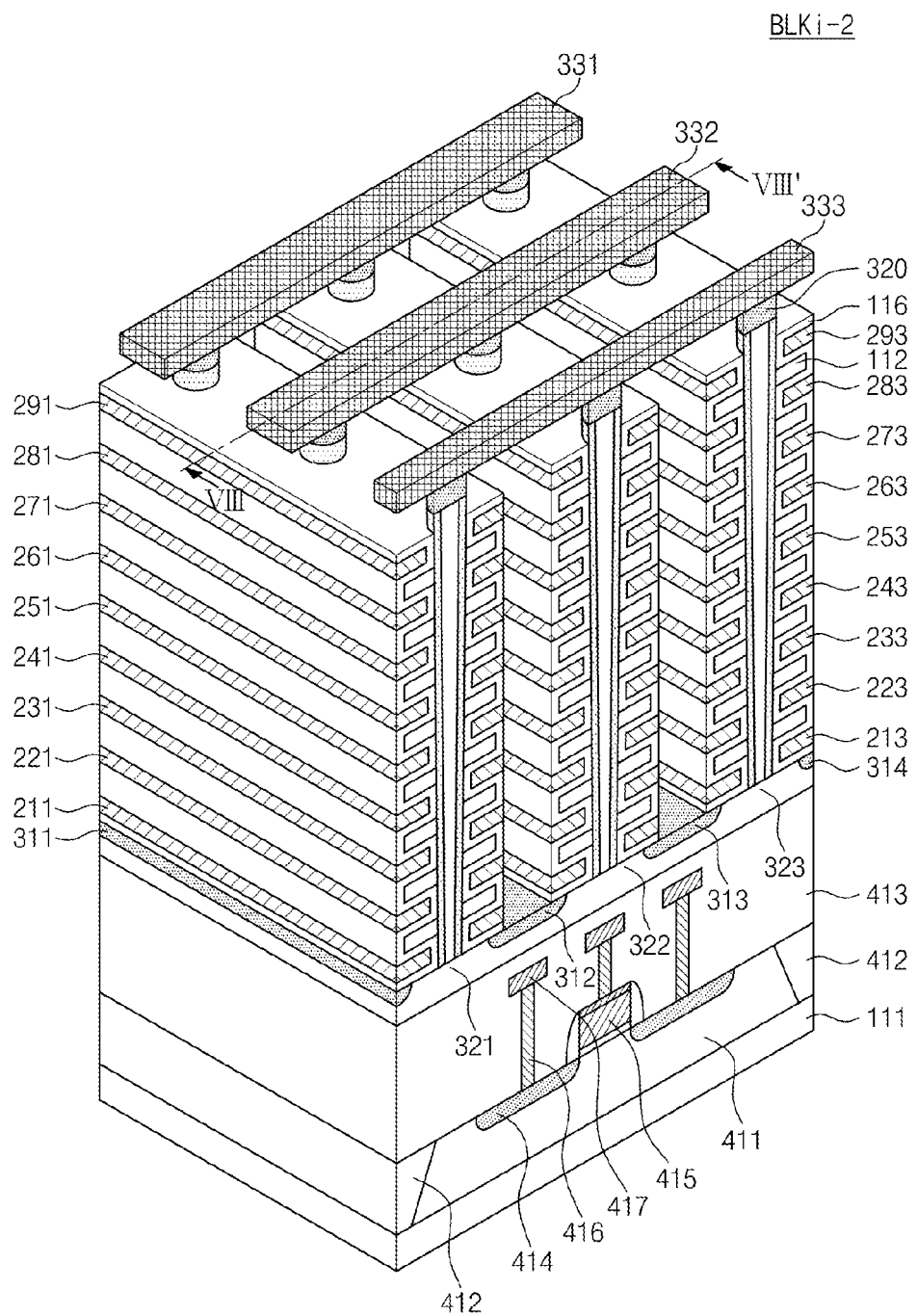
FIG. 7 is a perspective view illustrating an example of another block among the memory blocks in FIG. 2.
Figure 8:
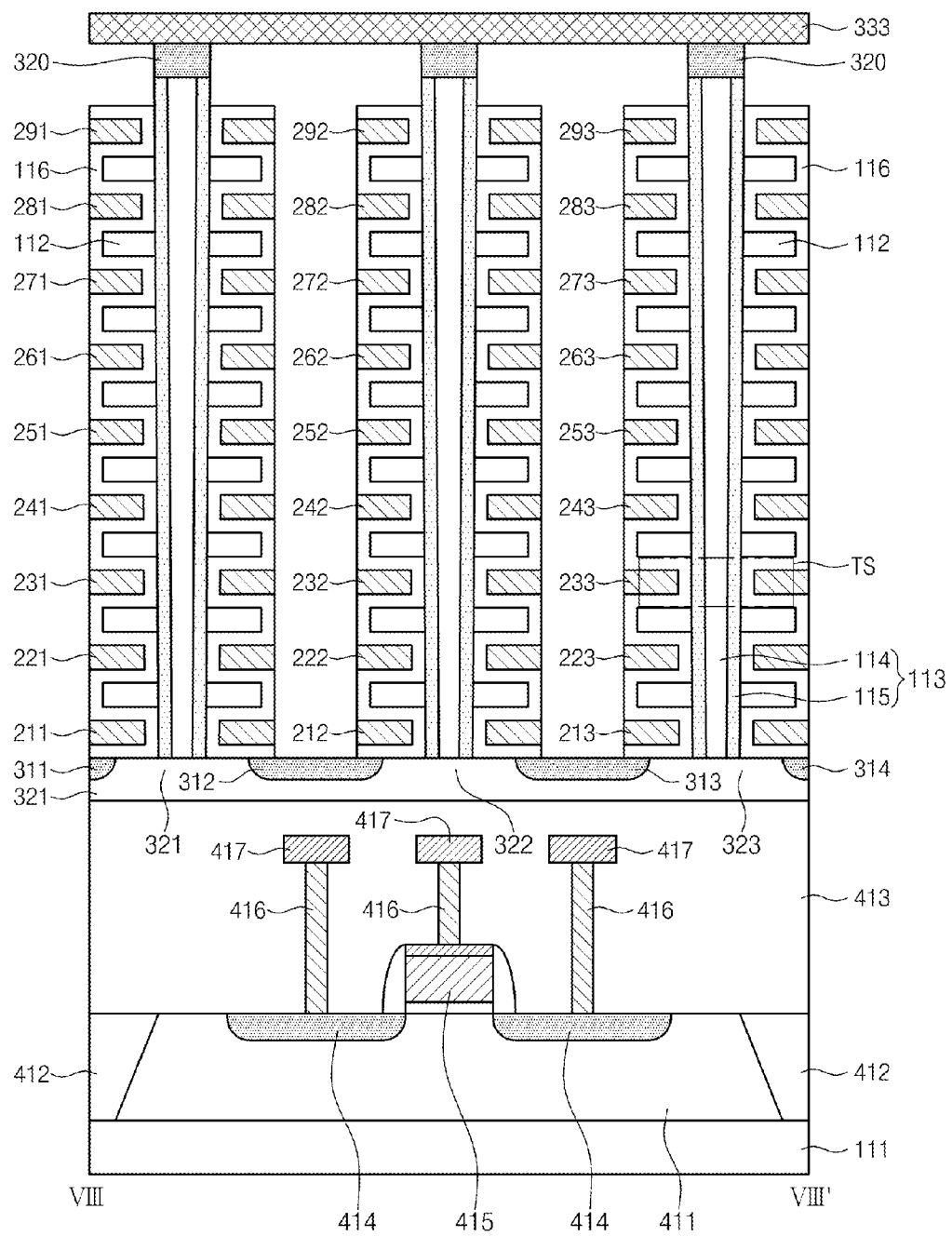
FIG. 8 is a cross-sectional view taken along a line VIII-VIII' of the memory block in FIG. 7.

FIG. 7 is a perspective view illustrating an example of another block BLKi-2 among the memory blocks BLK1 to BLKz in FIG. 2, and FIG. 8 is a cross-sectional view taken along a line VIII-VIII' of the memory block BLKi-2 in FIG. 7. Referring to FIGS. 7 and 8, the memory block BLKi-2 may include structures extending in first to third directions.

A substrate 111 is provided. In example embodiments, the substrate 111 may include a silicon material doped with first-type impurities. For example, the substrate 111 may include a silicon material doped with p-type impurities. For example, the substrate 111 may be a p-type well (e.g., pocket p-well). Hereinafter, let it be assumed that the substrate 111 may be p-type silicon substrate. However, the substrate 111 is not limited to the p-type silicon substrate.

A peripheral logic structure and a cell array structure may be sequentially stacked on the substrate 111. To put it another way, the peripheral logic structure may be disposed between the substrate 111 and the cell array structure when viewed vertically. That is, a peripheral circuit region and a cell array region may overlap when viewed from above.

The peripheral logic structure may include an address decoder 120 (see FIG. 1), a control logic 150, and a read/write circuit 140. These peripheral circuits may be formed on the entire surface of the substrate 111. The substrate 111 may include a well region 411 doped with n-type or p-type impurities. In the well region 411, active regions may be defined by a device isolation layer 412.

The peripheral logic structure may include a peripheral wordline 415, source and drain impurity regions 414 at opposite sides of the peripheral wordline 415, and a lower filling insulating layer 413 to cover peripheral circuits. More specifically, PMOS transistors may be formed on an n-well region and NMOS transistors may be formed on a p-well region. The peripheral wordline 415 may be disposed on the n-well region and the p-well region, and source and drain impurity regions 414 may be disposed at opposite sides of the peripheral wordline 415. Peripheral circuit plugs (not shown) and peripheral circuit interconnections 417 may be connected to the NMOS and PMOS transistors.

A cell array structure may include a horizontal semiconductor layer formed on the lower filling insulating layer 413 to cover peripheral circuits and may include stack structures including conductive materials 211 to 291, 212 to 292, and 213 to 293 vertically stacked on a horizontal semiconductor layer and a plurality of pillars 113 penetrating the stack structures, respectively.

The horizontal semiconductor layer may include silicon (Si), germanium (Ge) or a combination thereof and may be a layer of a semiconductor doped with impurities of a first conductivity type or a layer of an intrinsic semiconductor (undoped semiconductor). The horizontal semiconductor layer may have a crystal structure including at least one selected from a single crystalline structure, an amorphous structure, and a polycrystalline structure.

A plurality of doped regions 311 to 314 extending in the first direction are provided within the horizontal semiconductor layer. The horizontal semiconductor layer includes a plurality of well regions 321 to 323 separated by the doped regions 311 to 314. For example, the doped regions 311 to 314 may have a second conductivity type different from that of the well regions 321 to 323. For example, the doped regions 311 to 314 may have an n-type. Hereinafter, let it be assumed that first to fourth doped regions 311 to 314 may have an n-type. However, the conductivity type of the first to fourth doped regions 311 to 314 is not limited to the n-type.

A plurality of pillars 113 are provided on a corresponding well region 321 between the first and second doped regions 311 and 312. The pillars 113 are sequentially disposed in the first direction and penetrate insulating materials 112 in the second direction. In example embodiments, the pillars 113 may be in contact with the well region 321 through the insulating materials 112. The cell array structure stacked on the horizontal semiconductor layer has the same structure as shown in FIGS. 4 to 6 and will not be described in further detail. The well region 321 may include silicon (Si), germanium (Ge) or a combination thereof and may be a layer of a semiconductor doped with impurities of a first conductivity type or a layer of an intrinsic semiconductor (undoped semiconductor). Thus, the well region 321 may be higher in resistance than the substrate 111.

Figure 9:
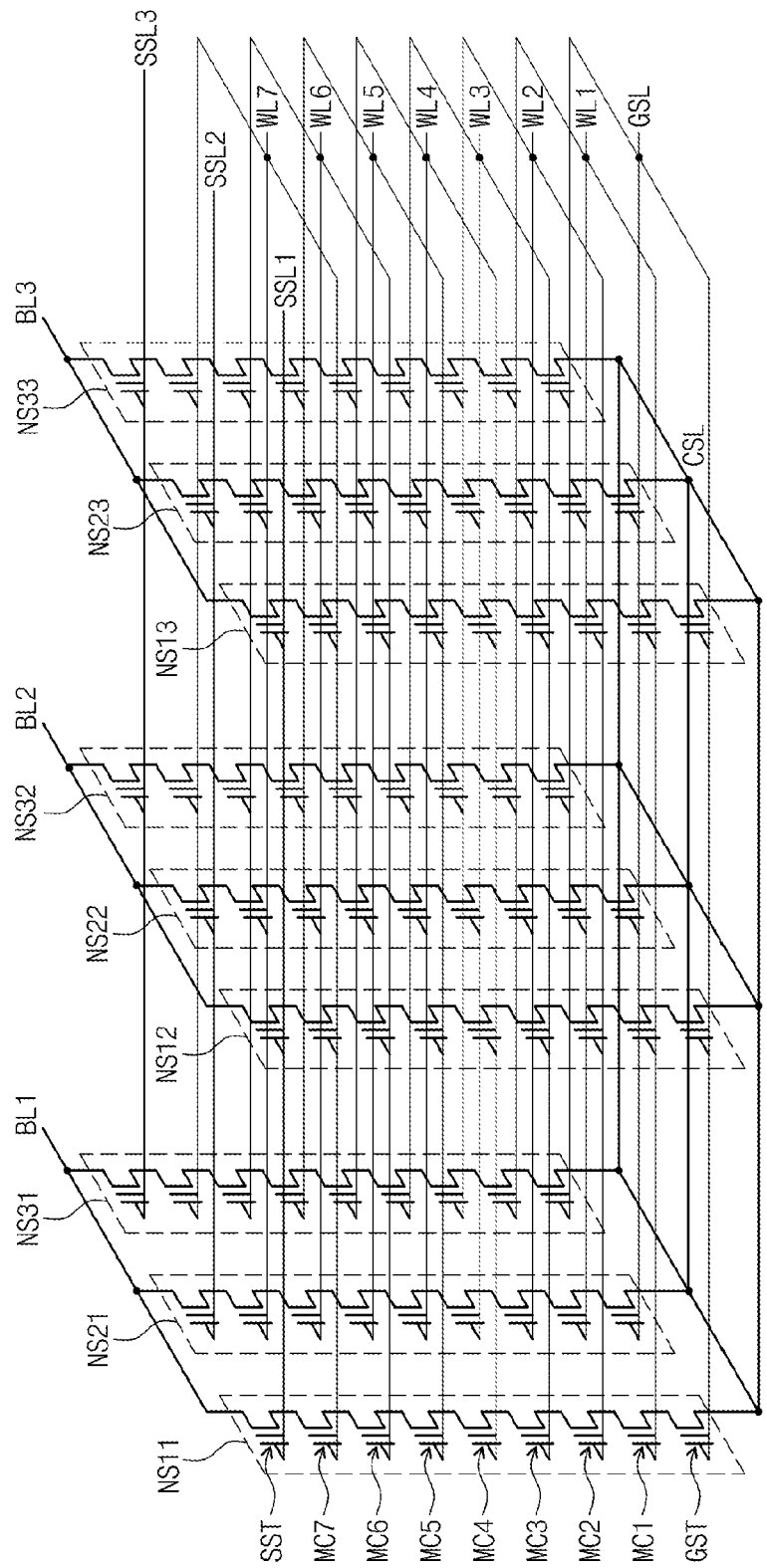
FIG. 9 is a circuit diagram of an equivalent circuit according to the memory blocks in FIGS. 4 and 7.

FIG. 9 is a circuit diagram of an equivalent circuit according to an example of the memory block BLKi-1 and BLKi-2 in FIGS. 4 and 7. Referring to FIG. 9, NAND strings NS11 to NS31 may be provided between a first bitline BL1 and a common source line CSL. NAND strings NS12 to NS32 may be provided between a second bitline BL2 and the common source line CSL. NAND strings NS13 to NS33 may be provided between a third bitline and the common source line CSL.

Each NAND string NS may include a string select transistor SST, a ground select transistor GST, and a plurality of memory cells MC coupled between the string select transistor SST and the ground select transistor GST. The string select transistor SST of each NAND string NS may be connected to a corresponding bitline BL. The ground select transistor of each NAND string NS may be connected to the common source line CSL.

NAND strings NS connected to a single bitline BL constitute a single column. For example, NAND strings NS11 to NS13 connected to a first string select line SSL1 may constitute a first column. NAND strings NS12 to NS32 connected to a second string select line SSL2 may constitute a second column. NAND strings NS13 to NS33 connected to a third string select line SSL3 may constitute a third column.

In each NAND string NS, height is defined. In example embodiments, in each NAND string NS, height of a memory cell MC1 adjacent to a ground select transistor GST is 1. In each NAND string NS, the more the memory cell is close to the string select transistor SST, the more height of a memory cell may increases. In each NAND string NS, height of a memory cell MC7 adjacent to the string select transistor SST is 7.

NAND strings NS of the same row may share a string select line SSL. NAND strings of different rows may be connected to different string select lines SSL. The NAND strings NS11 to NS13, NS21 to NS22, and NS31 to NS33 may share a ground select line GSL. Memory cells at the same height of NAND strings NS of the same row may share a wordline. At the same height, wordlines WL of NAND strings NS of different rows may be commonly connected. The common source line CSL may be commonly connected to the NAND strings NS.

Figure 10:
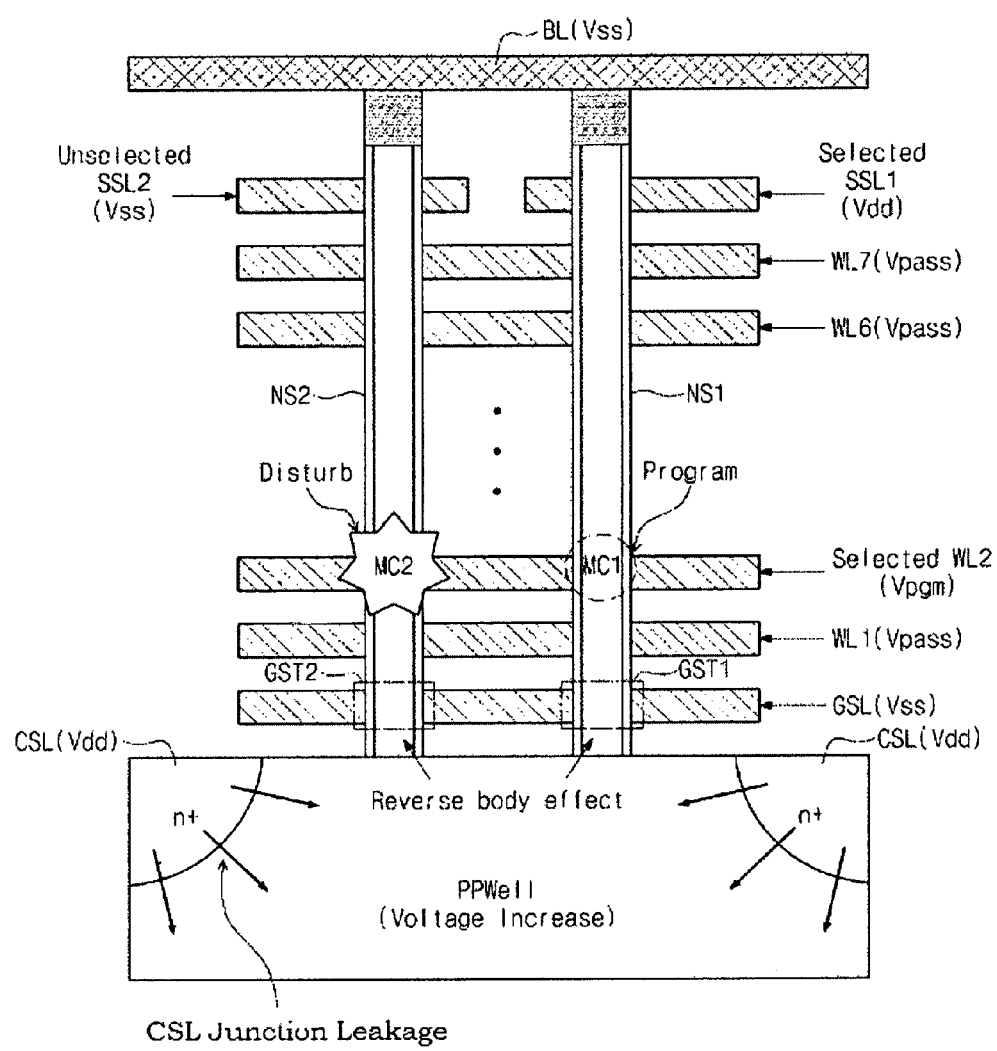
FIG. 10 illustrates abnormal disturbance.

FIG. 10 illustrates an abnormal disturbance. Referring to FIG. 10, abnormal disturbance may occur during a program operation. Hereinafter, a description will be made with respect to a case where a first memory cell MC1 is programmed.

First and second NAND strings NS1 and NS2 may be connected to a pocket p-well PPWell. The first and second NAND strings NS1 and NS2 may share wordlines WL1 to WL7 and a ground select line GSL. However, the first and second NAND strings NS1 and NS2 may be connected to different string select lines SSL, respectively. For example, the first NAND string NS1 may be connected to a first string select line SSL1. The second NAND string NS2 may be connected to a second string select line SSL2. A common source line CSL may be doped with n-type dopants to be formed on the pocket p-well PPWell. The pocket p-well may be a substrate explained in FIG. 4 or a semiconductor layer explained in FIG. 7.

During a program operation, a ground voltage Vss may be applied to a bitline BL connected to a memory cell MC1 to be programmed. A power supply voltage Vdd may be applied to a selected string select line SSL. A ground voltage Vss may be applied to an unselected string select line SSL. The ground voltage Vss may be applied to the ground select line GSL. At this point, if a program voltage Vpgm is applied to a selected wordline WL2, the first memory cell MC1 may be programmed. A pass voltage Vpass may be applied to unselected wordlines WL1 and WL3 to WL7.

While the program operation is performed, a power supply voltage Vdd may be applied to the common source line CSL. However, leakage current may be generated from a junction of the common source line CSL to the pocket p-well PPWell. This phenomenon is defined as common source line junction leakage. The pocket p-well has relatively higher resistance than a metal material. Therefore, a voltage of the pocket p-well PPWell may increase due to the common source line junction leakage. For example, the voltage of the pocket p-well PPWell may increase by 0.5 volt. When the voltage of the pocket p-well PPWell increases, the reverse body effect may occur at first and second ground select transistors GST1 and GST2. Accordingly, the first and second ground select transistors GST1 and GST2 may be turned on because their threshold voltages decrease. When the first and second ground select transistors GST1 and GST2 are turned on, a soft program occurs, e.g., abnormal disturbance occurs in the second memory cell MC2.

Programming methods for (limiting and/or preventing) the abnormal disturbance will now be described with reference to FIGS. 11 to 17.

Figure 11:
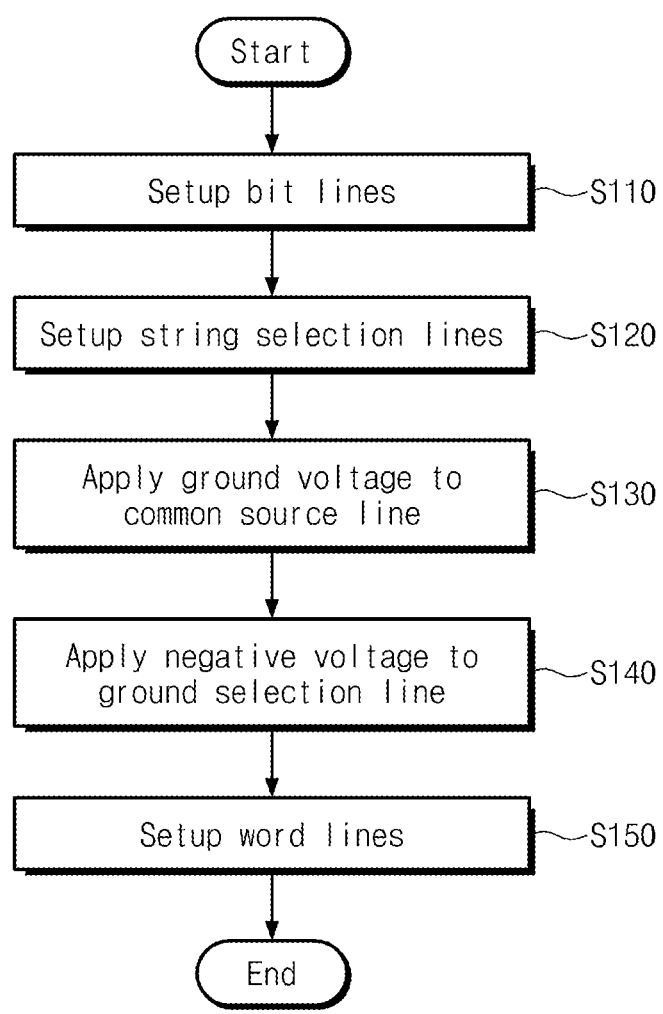
FIG. 11 is a flowchart summarizing an example of a programming method according to example embodiments of inventive concepts.

FIG. 11 is a flowchart summarizing a programming method according example embodiments of inventive concepts. Referring to FIG. 11, a nonvolatile memory device 100 may generate a first negative voltage Vneg1. During a program operation, the nonvolatile memory device 100 may supply the first negative voltage Vneg1 to a ground select line GSL.

The nonvolatile memory device 100 may setup bitlines BL when receiving a program request (S110). For example, the nonvolatile memory device 100 may apply a ground voltage Vss to selected bitlines BL. That is, the ground voltage Vss may be applied to a bitline BL to which a programmed memory cell is connected. The nonvolatile memory device 100 may apply a power supply voltage Vdd to unselected bitlines BL. That is, the power supply voltage Vdd may be applied to a bitline BL to which a program-inhibited memory cell is connected.

The nonvolatile memory device 100 may setup string select lines SSL (S120). For example, the nonvolatile memory device 100 may apply the power supply voltage Vdd to the selected string select line SSL. The nonvolatile memory device 100 may apply the ground voltage Vss to the unselected string select line SSL.

The nonvolatile memory device 100 may apply the ground voltage Vss to the common source line CSL (S130). When the ground voltage Vss is applied to the common source line CSL, common source line junction leakage may be reduced. If the common source line junction leakage is reduced, abnormal disturbance may be (limited and/or prevented).

The nonvolatile memory device 100 may apply a first negative voltage Vneg1 to the ground select line GSL (S140). For example, the first negative voltage Vneg1 and the power supply voltage Vdd are equal in magnitude and opposite in sign. One of ordinary skill in the art would appreciate that variations of the first negative voltage Vneg1 relative to the power supply voltage Vdd are possible. For example, in some cases, the first negative voltage Vneg1 may be opposite in sign than the power supply voltage Vdd but have a different magnitude (e.g., greater than or lower than).

In example embodiments, the first negative voltage Vneg1 may be −2 volt. When the ground voltage Vss is applied to the common source line CSL (S130), program inhibit characteristics may be deteriorated. For this reason, the nonvolatile memory device 100 may enhance the program inhibit characteristics by applying the first negative voltage Vneg1 to the ground select line GSL.

The nonvolatile memory device 100 may setup wordlines WL (S150). For example, the nonvolatile memory device 100 may apply a pass voltage Vpass between all the wordlines WL. Then the nonvolatile memory device 100 may apply a program voltage Vpgm to a selected wordline WL. When the program voltage is applied, a selected memory cell MC may be programmed.

Through S130 to S140, the nonvolatile memory device 100 may limit (and/or prevent) abnormal disturbance.

Figure 12:
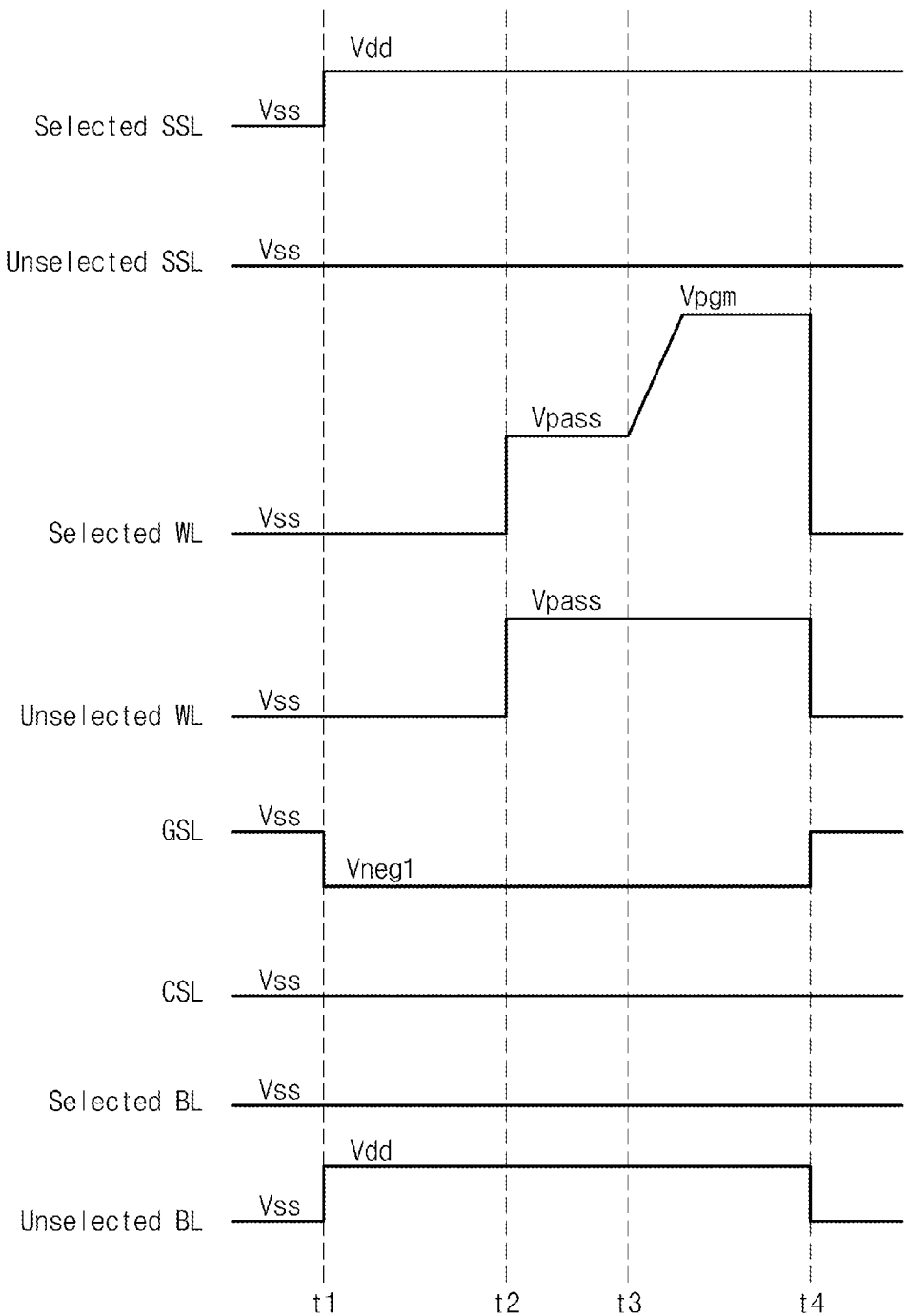
FIG. 12 is an example of a timing diagram according to the programming method in FIG. 11.

FIG. 12 is an example of a timing diagram according to the programming method in FIG. 11. Referring to FIG. 12, a nonvolatile memory device 100 may generate a first negative voltage Vneg1. During a program operation, the nonvolatile memory device 100 may supply the first negative voltage Vneg1 to a ground select line GSL. For example, the first negative voltage Vneg1 may be equal in magnitude and opposite in sign. In example embodiments, the first negative voltage Vneg1 may be −2 volt.

At a first time point t1, the nonvolatile memory device 100 may setup bitlines BL. For example, the nonvolatile memory device 100 may apply a ground voltage Vss to selected bitlines BL. That is, the ground voltage Vss may be applied to a bitline BL to which a programmed memory cell is connected. The nonvolatile memory device 100 may apply a power supply voltage Vdd to selected bitlines BL. That is, the power supply voltage Vdd may be applied to bitlines BL to which a program-inhibited memory cells is connected.

The nonvolatile memory device 100 may setup string select lines SSL. For example, the nonvolatile memory device 100 may apply the power supply voltage Vdd to a selected string select line SSL. The nonvolatile memory device 100 may apply the ground voltage Vss to an unselected string select line SSL.

The nonvolatile memory device 100 may apply the ground voltage Vss to the common source line CSL. When the ground voltage Vss is applied to the common source line CSL, common source line junction leakage may be reduced. If the common source line junction leakage is reduced, abnormal disturbance may be (limited and/or prevented). However, when the ground voltage Vss is applied to the common source line CSL, program inhibit characteristics may be deteriorated. For this reason, the nonvolatile memory device 100 may enhance the program inhibit characteristics by applying the first negative voltage Vneg1 to the ground select line GSL.

At a second time point t2, the nonvolatile memory device 100 may setup wordlines WL. For example, the nonvolatile memory device 100 may apply a pass voltage Vpass to all the wordlines WL. When the pass voltage Vpass is applied to all the wordlines WL, a channel of each NAND string may be boosted. In example embodiments, the pass voltage Vpass may be 9 volts.

At a third time point t3, the nonvolatile memory device 100 may apply a program voltage Vpgm to a selected wordline WL. For example, the program voltage Vpgm may be a high voltage of 20 volts. When the program voltage Vpgm is applied, a selected memory cell MC may be programmed.

At a fourth time point t4, the nonvolatile memory device 100 may perform a recovery operation. After the fourth time point t4, the wordlines WL, the bitlines BL, and the ground select line GSL may return to states before the first time point t1.

The nonvolatile memory device 100 according to example embodiments of inventive concepts may apply a ground voltage Vss to a common source line CSL during a program operation. Thus, common source line junction leakage and abnormal disturbance may be (limited and/or prevented). However, when the ground voltage Vss is applied to the common source line CSL, program inhibit characteristics may be deteriorated. For this reason, the nonvolatile memory device 100 may enhance the program inhibit characteristics by applying a first negative voltage Vneg1 to the ground select line GSL.

Figure 13:
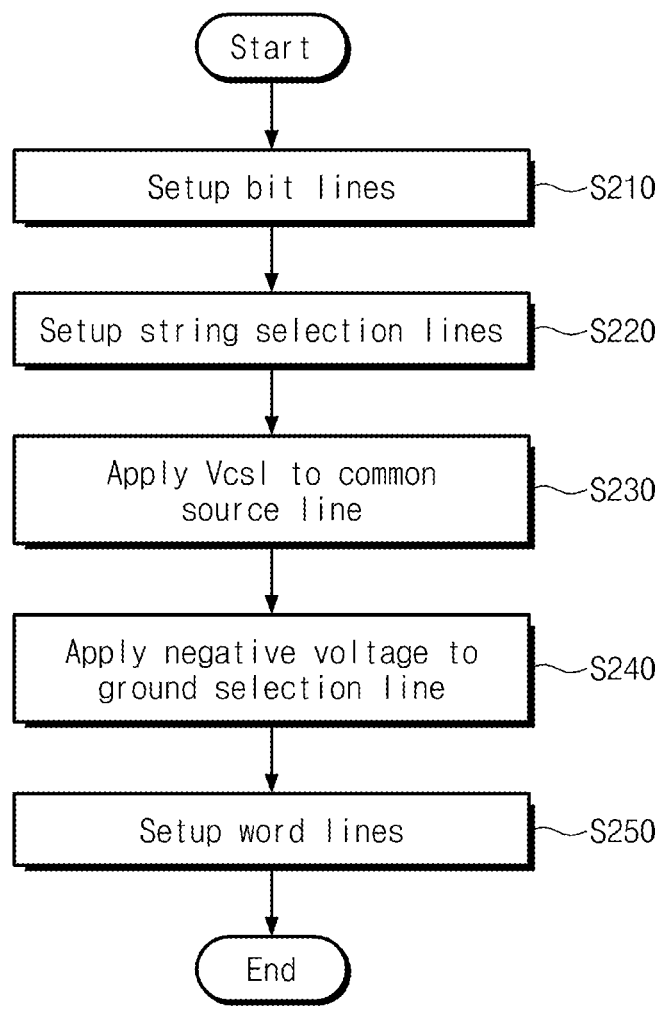
FIG. 13 is a flowchart summarizing another programming method according to example embodiments.

FIG. 13 is a flowchart summarizing another programming method according example embodiments of inventive concepts. Referring to FIG. 13, a nonvolatile memory device 100 may generate a second negative voltage Vneg2 higher than the first negative voltage Vneg1 explained in FIGS. 11 and 12. For example, the second negative voltage Vneg2 may be −1 volt. During a program operation, the nonvolatile memory device 100 may apply the second negative voltage Vneg2 to a ground select line GSL.

The nonvolatile memory device 100 may setup bitlines BL when receiving a program request (S210). For example, the nonvolatile memory device 100 may apply a ground voltage Vss to selected bitlines BL. The nonvolatile memory device 100 may apply a power supply voltage Vdd to unselected bitlines BL.

The nonvolatile memory device 100 may setup string select bitlines SSL (S220). For example, the nonvolatile memory device 100 may apply the power supply voltage Vdd to a selected string select line SSL. The nonvolatile memory device 100 may apply the ground voltage Vss to an unselected string select line SSL.

The nonvolatile memory device 100 may apply a source line voltage Vcs1 to a common source line CSL (S230). For example, the source line voltage Vcs1 may be higher than the ground voltage Vss and lower than the power supply voltage Vdd. In example embodiments, the source line voltage Vcs1 may be 0.5 volt. When the ground voltage Vss is applied to the common source line CSL, the common source line junction leakage may be reduced. If the common source line junction leakage is reduced, abnormal disturbance may be (limited and/or prevented).

The nonvolatile memory device 100 may apply a second negative voltage Vneg2 to the ground select line GSL (S240). For example, the nonvolatile memory device 100 may apply a voltage of −1 volt to the ground select line GSL. Since the source line voltage Vcs1 higher than the ground voltage Vss is applied to the common source line CSL (S230), the nonvolatile memory device 100 may enhance program inhibit characteristics by applying the second negative voltage Vneg2 higher than the first negative voltage Vneg1 to the ground select line GSL.

The nonvolatile memory device 100 may setup wordlines WL (S250). For example, the nonvolatile memory device 100 may apply a pass voltage Vpass to all the wordlines WL. Then the nonvolatile memory device 100 may apply a program voltage Vpgm to a selected wordline WL. When the program voltage Vpgm is applied, a selected memory cell MC may be programmed.

Through S230 and 240, the nonvolatile memory device 100 may limit (and/or prevent) the abnormal disturbance.

Figure 14:
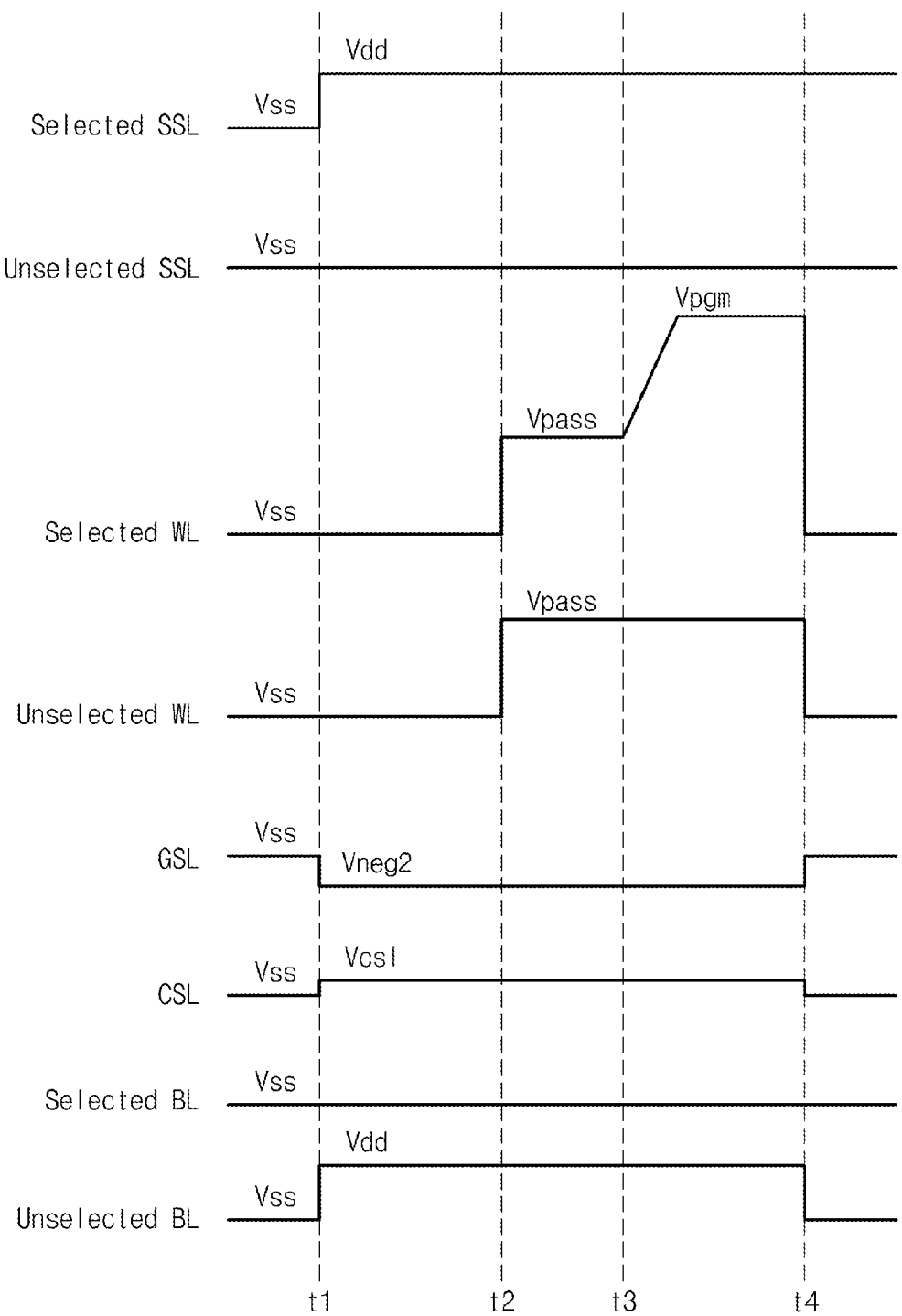
FIG. 14 is an example of a timing diagram illustrating an example according to the programming method in FIG. 13.

FIG. 14 is an example of a timing diagram according to the programming method in FIG. 13. Referring to FIG. 14, a nonvolatile memory device 100 may generate a second negative voltage Vneg2 higher than the first negative voltage Vneg1 explained in FIGS. 11 and 12. For example, the second negative voltage Vneg2 may be −1 volt. During a program operation, the nonvolatile memory device 100 may supply the second negative voltage Vneg2 to a ground select line GSL.

At a first time point t1, the nonvolatile memory device 100 may apply a source line voltage Vcs1 to a common source line CSL. For example, the source line voltage Vcs1 may be higher than a ground voltage Vss and lower than a power supply voltage Vdd. In example embodiments, the common source line voltage Vcs1 may be 0.5 volt. When the source line voltage Vcs1 is applied to the common source line CSL, common source line junction leakage may be reduced. If the common source line junction leakage is reduced, abnormal disturbance may be (limited and/or prevented). However, when the source line voltage Vcs1 lower than the power supply voltage Vdd is applied to the common source CSL, program inhibit characteristics may be deteriorated. For this reason, the nonvolatile memory device 100 may enhance the program inhibit characteristics by applying a second negative voltage Vneg2 to the ground select line GSL. Since the source line voltage Vcs1 higher than the ground voltage Vss is applied to the common source line CSL, the nonvolatile memory device 100 may enhance the program inhibit characteristics by applying the second negative voltage Vneg2 higher than the first negative voltage Vneg1 to the ground select line GSL.

Since the other parts shown in FIG. 14 are identical or similar to those shown in FIG. 12, their explanations will be omitted herein.

Figure 15:
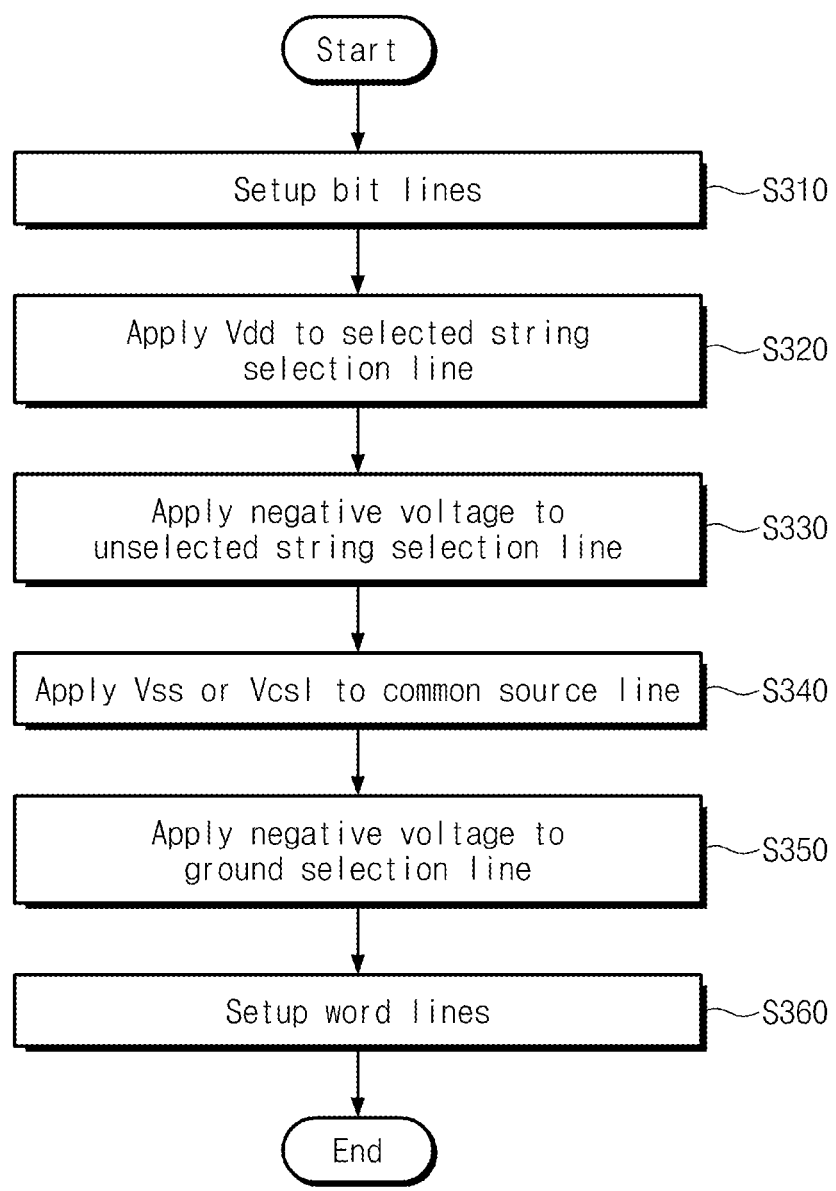
FIG. 15 is a flowchart summarizing another programming method according to example embodiments of inventive concepts.

FIG. 15 is a flowchart summarizing another programming method according example embodiments of inventive concepts. Referring to FIG. 15, a nonvolatile memory device 100 may generate the first negative voltage Vneg1 explained in FIG. 11 or the second negative voltage Vneg2 explained in FIG. 13. For example, the nonvolatile memory device 100 may generate the first negative voltage Vneg1 or the second negative voltage Vneg2 according to the configuration of a negative voltage generator NV. The first negative voltage Vneg1 may have a lower level than the second negative voltage Vneg2. In example embodiments, the first negative voltage Vneg1 may be −2 volt and the second negative voltage Vneg2 may be 1 volt. During a program operation, the nonvolatile memory device 100 may supply the first negative voltage Vneg1 or the second negative voltage Vneg2 to an unselected string select line SSL.

The nonvolatile memory device 100 may setup bitlines BL when receiving a program request (S310).

The nonvolatile memory device 100 may apply a power supply voltage Vdd to a selected string select line SSL (S320).

The nonvolatile memory device 100 may apply the first negative voltage Vneg1 or the second negative voltage Vneg2 to an unselected string select line SSL (S330). When the first negative voltage Vneg1 or the second negative voltage Vneg2 is applied to an unselected string select line SSL, the nonvolatile may enhance program inhibit characteristics at the unselected bitline more than in the programming methods illustrated in FIGS. 11 and 13.

For example, when the first negative voltage Vneg1 is generated according to the configuration of the negative voltage generator NV, the nonvolatile memory device 100 may apply the first negative voltage Vneg1 to an unselected string select line SSL.

For example, when the second negative voltage Vneg2 is generated according to the configuration of the negative voltage generator NV, the nonvolatile memory device 100 may apply the second negative voltage Vneg2 to an unselected string select line SSL.

The nonvolatile memory device 100 may apply the ground voltage Vss or the source line voltage Vcs1 to the common source line CSL (S340). For example, the source line voltage Vcs1 may be higher than the ground voltage Vss and lower than the power supply voltage Vdd. In example embodiments, the source line voltage Vcs1 may be 0.5 volt. When the ground voltage Vss or the source line voltage Vcs1 lower than the power supply voltage Vdd is applied to the common source line CSL, common source line junction leakage may be reduced. If the common source line junction leakage is reduced, abnormal disturbance may be (limited and/or prevented).

For example, the first negative voltage Vneg1 is applied to the unselected string select line SSL (S330), the nonvolatile memory device 100 may apply the ground voltage Vss to the common source line CSL.

For example, the second negative voltage Vneg2 is applied to the unselected string select line SSL (S330), the nonvolatile memory device 100 may apply the source line voltage Vcs1 to the common source line CSL.

The nonvolatile memory device 100 may apply the first negative voltage Vneg1 or the second negative voltage Vneg2 to the ground select line GSL (S350). When the ground voltage Vss or the source line voltage Vcs1 lower than the power supply voltage Vdd is applied to the common source line CSL (S340), the program inhibit characteristics may be deteriorated. For this reason, the nonvolatile memory device 100 may enhance the program inhibit characteristics by applying the first negative voltage Vneg1 or the second negative voltage Vneg2 to the ground select line GSL.

For example, when the first negative voltage Vneg1 is applied to the unselected string select line SSL (S330), the nonvolatile memory device 100 may apply the first negative voltage Vneg1 to the ground select line GSL.

For example, when the second negative voltage Vneg2 is applied to the unselected string select line SSL (S330), the nonvolatile memory device 100 may apply the second negative voltage Vneg2 to the ground select line GSL.

The nonvolatile memory device 100 may setup wordlines WL (S360). For example, the nonvolatile memory device 100 may apply a pass voltage Vpass to all the wordlines WL. Then the nonvolatile memory device 100 may apply a program voltage Vpgm to a selected wordline WL. When the program voltage Vpgm is applied, a selected memory cell MC may be programmed.

Through S330 to S350, the nonvolatile memory device 100 limit (and/or prevent) abnormal disturbance.

Figure 16:
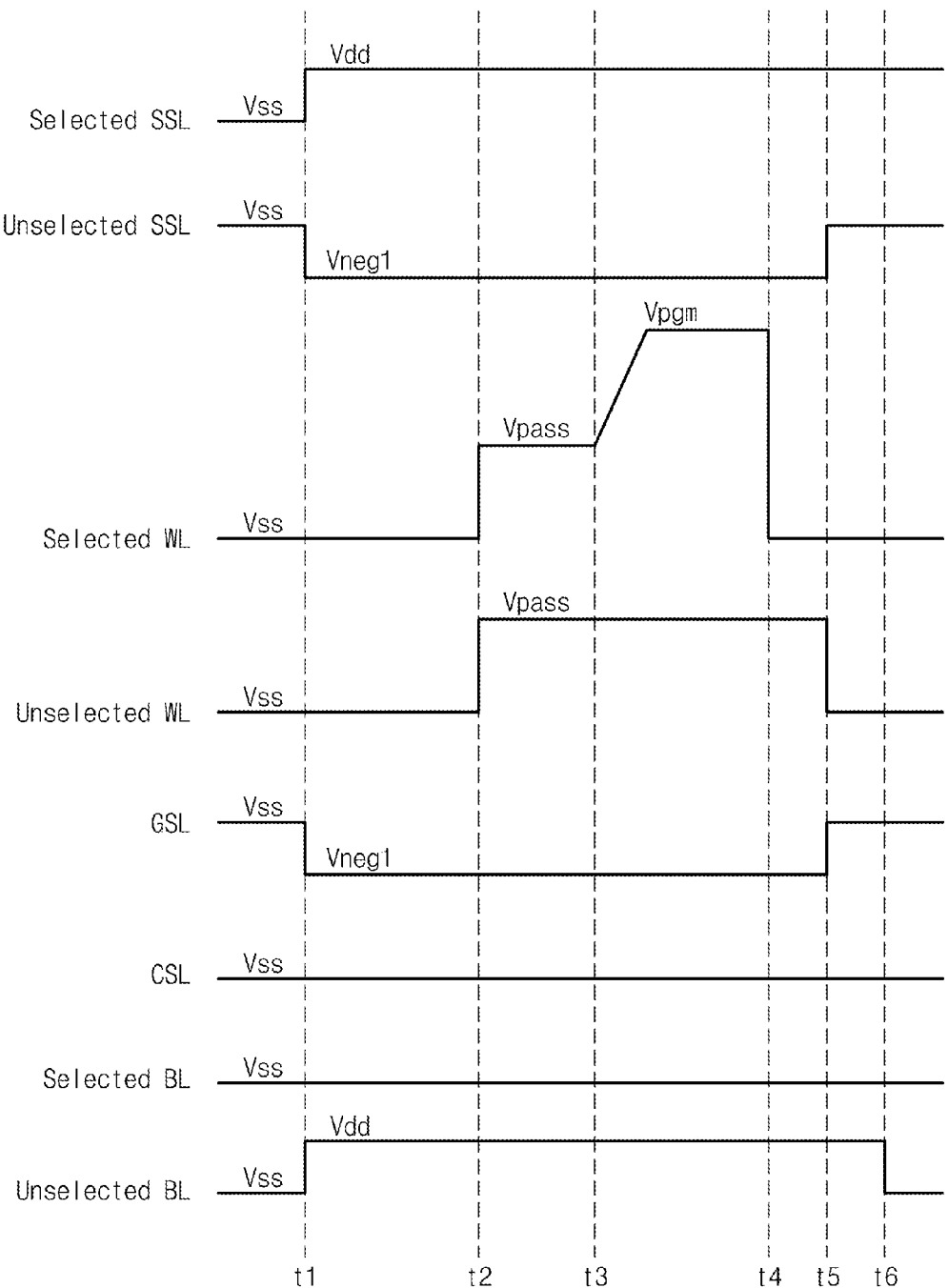
FIG. 16 is an example of a timing diagram illustrating an example according to the programming method in FIG. 15.

FIG. 16 is an example of a timing diagram according to the programming method in FIG. 15. Referring to FIG. 16, the nonvolatile memory device 100 may supply the first negative voltage Vneg1 to the ground select line GSL during a program operation. For example, the first negative voltage Vneg1 and the power supply voltage Vdd are equal in magnitude and opposite in sign. In example embodiments, the first negative voltage Vneg1 may be −2 volt.

At a first time point t1, the nonvolatile memory device 100 may apply a first negative voltage Vneg1 to an unselected string select line SSL. When the first negative voltage Vneg1 is applied to the unselected string select line SSL, the nonvolatile memory device 100 may enhance program inhibit characteristics more than in the programming method illustrated in FIG. 12.

At a fourth time point t4, the nonvolatile memory device 100 may perform a recovery operation. At the fourth time point t4, the recovery operation may be gradually performed. A ground voltage Vss may be applied to a selected wordline WL. At a fifth time point t5, the ground voltage Vss may be applied to unselected string select lines SSL, unselected wordlines WL, and the ground select line GSL. At the sixth time point t6, the ground voltage Vss may be applied to unselected bitlines BL. Program disturbance may be (limited and/or prevented) through the gradual recovery operation. However, the recovery operation is not limited thereto.

Since the other parts shown in FIG. 16 are identical or similar to those shown in FIG. 12, their explanations will be omitted herein.

Figure 17:
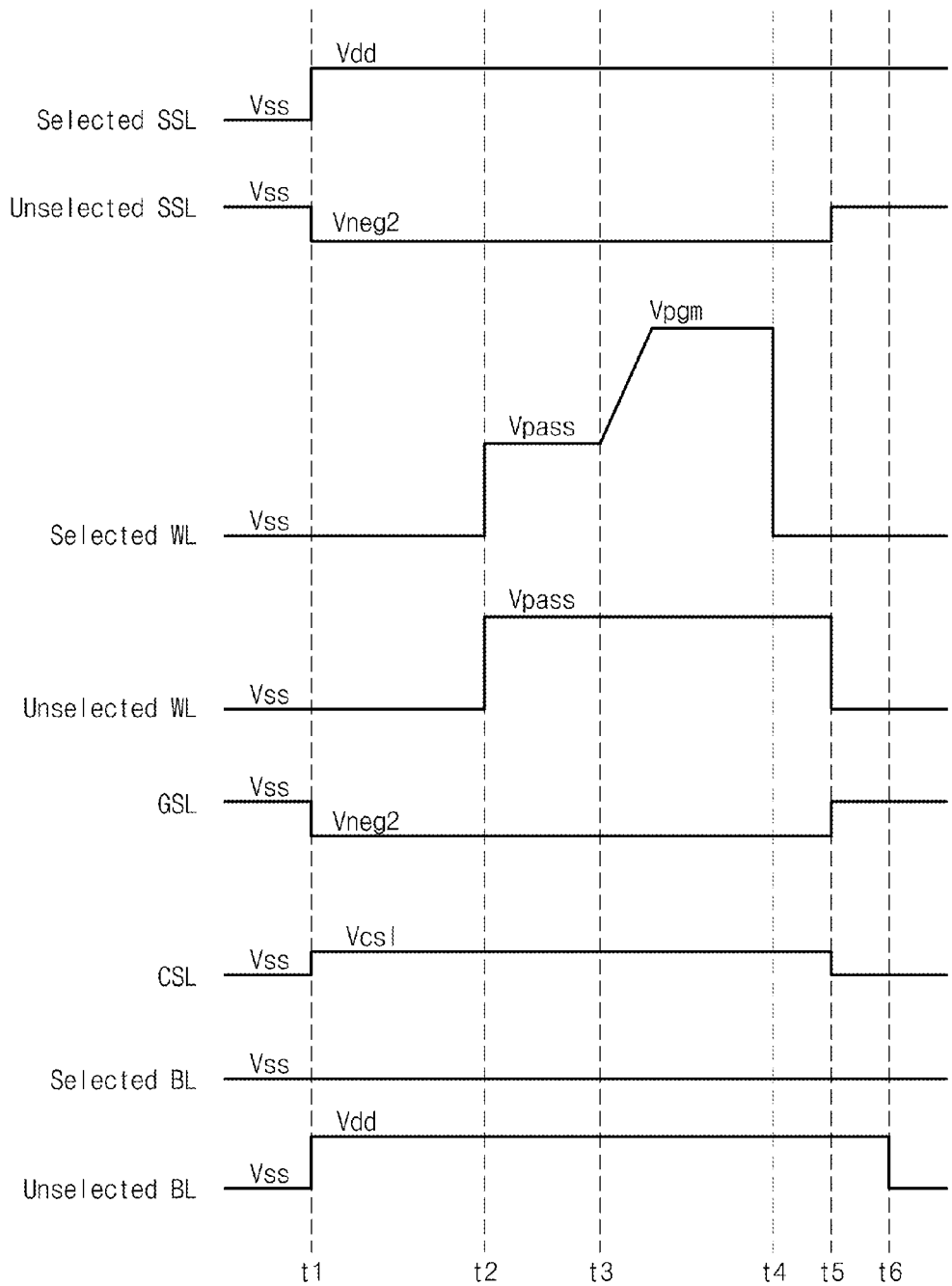
FIG. 17 is an example of a timing diagram illustrating another example according to the programming method in FIG. 15.

FIG. 17 is an example of a timing diagram illustrating according to the programming method in FIG. 15. Referring to FIG. 17, the nonvolatile memory device 100 may generate a second negative voltage Vneg2 higher than the first negative voltage Vneg1 explained in FIG. 16. For example, the second negative voltage Vneg2 may be −1 volt. During a program operation, the nonvolatile memory device 100 may supply the second negative voltage Vneg2 to a ground select line GSL.

At a first time point t1, the nonvolatile memory device 100 may apply a power supply voltage Vdd to a selected string select line SSL. The nonvolatile memory device 100 may apply a second negative voltage Vneg2 to an unselected string select line SSL. When the second negative voltage Vneg2 is applied to the unselected string select line SSL, the nonvolatile memory device 100 may enhance program inhibit characteristics at an unselected bitline BL more than in the programming method illustrated in FIG. 14.

The nonvolatile memory device 100 may apply a source line voltage Vcs1 to a common source line CSL. For example, the source line voltage Vcs1 may be higher than a ground voltage Vss and lower than a ground voltage Vdd. In example embodiments, the source line voltage Vcs1 may be 0.5 volt. Since the source line voltage Vcs1 higher than the ground voltage Vss is applied to the common source line CSL, the nonvolatile memory device 100 may enhance program inhibit characteristics by applying the second negative voltage Vneg2 to the ground select line GSL.

Since the other parts shown in FIG. 17 are identical or similar to those shown in FIG. 12, their explanations will be omitted herein.

Figure 18:
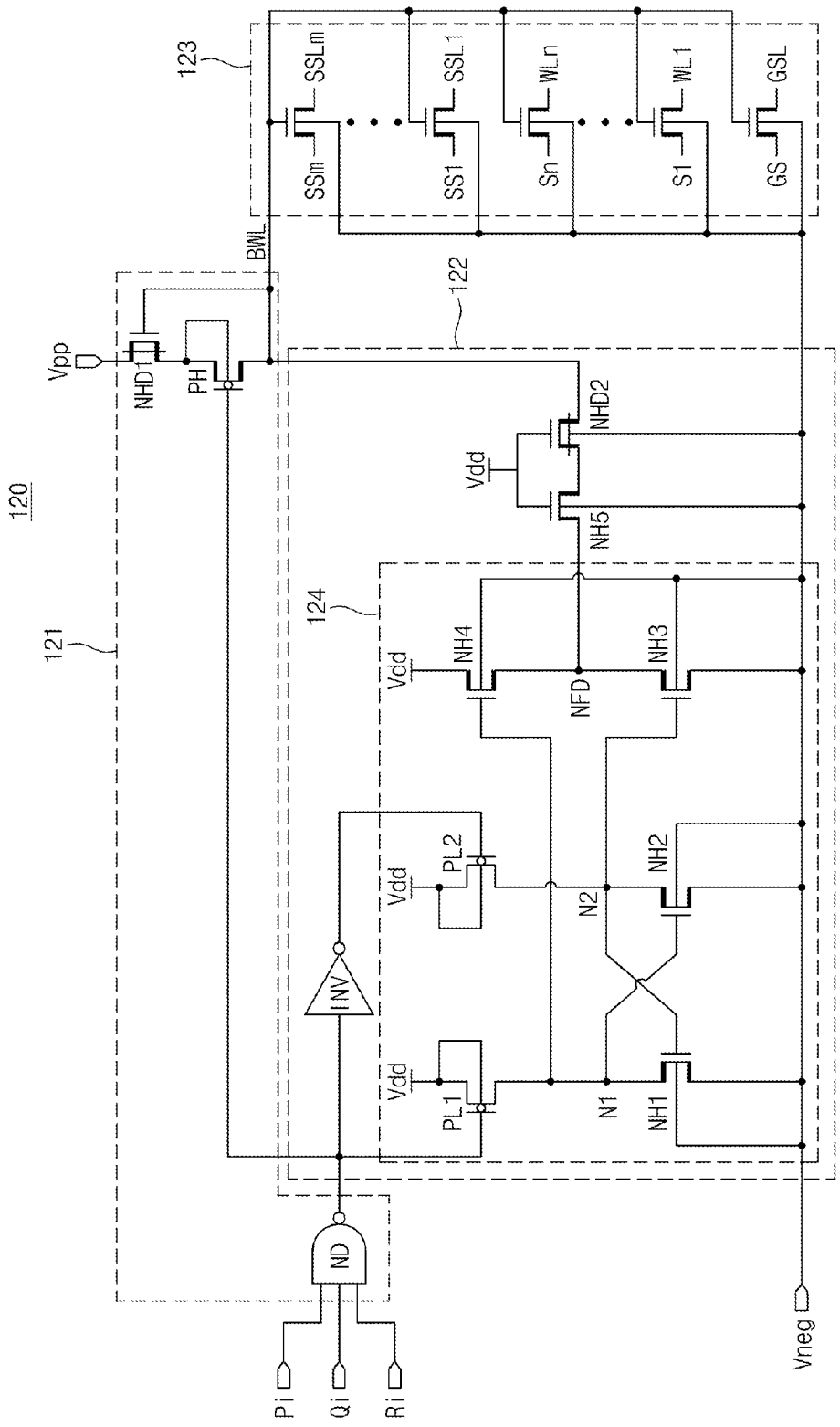
FIG. 18 is a circuit diagram illustrating an example of an address decoder in FIG. 1.

FIG. 18 is a circuit diagram illustrating an example of the address decoder 120 in FIG. 1. For brevity of description, only one address decoder 120 is shown in FIG. 18. However, the nonvolatile memory device 100 may include a plurality of address decoders that correspond to a plurality of memory blocks, respectively. As illustrated, the address decoder 120 may include a pull-up circuit 121, a pull-down circuit 122, and a voltage transfer circuit 123.

A NAND gate ND and an inverter INV may constitute a block decoder. The NAND gate ND may perform a NAND operation on decoding signals P1, Qi, and Ri provided by a row address. An output of the NAND gate ND may be inverted by an inverter INV. Undoubtedly, it will be understood that the address decoder 120 may further include an element for cutting off an output of the NAND gate ND depending on whether a block is a bad block.

The pull-up circuit 121 may be coupled between a high voltage Vpp and a block wordline BWL and apply the high voltage to the block wordline BWL in response to an output signal of the NAND gate ND.

The pull-up circuit 121 may include a first depletion mode transistor NHD1, a high-voltage PMOS transistor PH, and a NAND gate ND. The first depletion mode transistor NHD1 may include a drain connected to the high voltage Vpp and a gate connected to the block wordline BWL. The high-voltage PMOS transistor PH may include a source connected to a source of the first depletion mode transistor NHD1, a drain connected to the block wordline line BWL, and a gate to which the output of the NAND gate is input. The pull-up circuit 121 may apply the high voltage Vpp to the block wordline BWL in response to the high-level output signal of the NAND gate ND. A procedure of applying the high voltage Vpp to the block wordline BWL will now be described below.

The high-voltage PMOS transistor PH may be turned on in response to a low-level output signal of the NAND gate ND. In this case, let it be assumed that an initial level of the block wordline BWL is 0 volt. Accordingly, the first depletion mode transistor NHD1 may apply a threshold voltage (e.g., about 2 volt) to the block wordline BWL in response to a gate voltage of 0 volt. Thus, a voltage of the block wordline BWL increases. At the same time, the increasing voltage of the block wordline line BWL may be fed back to be input to the gate of the first depletion mode transistor NHD1. The first depletion mode transistor NHD1 may increase the voltage of the block wordline BWL in response to the fed-back voltage. The first depletion mode transistor NHD1 may limit (and/or prevent) the voltage of the block wordline BWL from increasing rapidly. By repeating this procedure, the voltage of the block wordline BWL may increase to the high voltage Vpp.

Meanwhile, the high-voltage PMOS transistor PH may be turned off in response the high-level output signal of the NAND gate ND.

The pull-down circuit 122 may electrically isolate the block wordline BWL from a voltage applied to a well of the address decoder 120 when the high voltage Vpp is applied to the block wordline BWL in response to the output signal of the NAND gate ND. The pull-down circuit 122 may electrically connect the well of the address decoder 120 to the block wordline BWL in response to the output signal of the NAND gate ND. That is, the pull-down circuit 122 may apply a well voltage applied from the well of the address decoder 120 to the block wordline BWL in response to the output signal of the NAND gate ND.

The pull-down circuit 122 may include a second depletion mode transistor NHD2, low-voltage PMOS transistors PL1 and PL2, high-voltage NMOS transistor NH1 to NH5, and an inverter INV.

The second depletion mode transistor NHD2 and the fifth high-voltage NMOS transistor NH5 may be coupled between the block wordline BWL and a blocking node NFD, electrically isolate the pull-down circuit 122 from the block wordline BWL in response to the low-level output signal of the NAND gate ND, and may electrically connect the pull-down circuit 122 from the block wordline BWL in response to the high-level output signal of the NAND gate ND.

Now, a description will be made with respect to a procedure of electrically isolating the pull-down circuit 122 from the block wordline BWL in response to the low-level output signal of the NAND gate ND. The low-voltage PMOS transistor PL1 may be turned on in response to the low-level output signal of the NAND gate ND. As the low-voltage PMOS transistor PL1 is turned on, a power supply voltage Vdd is input to a gate of the low-voltage PMOS transistor PL1. Thus, the fourth high-voltage NMOS transistor NH4 may be turned on. For this reason, the power supply voltage Vdd may be applied to the blocking node NFD. If a voltage of the blocking node NFD further increases by a threshold voltage of the second depletion mode transistor NHD2, the second depletion mode transistor NHD2 may be shut off. Thus, the pull-down circuit 122 may be electrically isolated from the block wordline BWL in response to the low-level output signal of the NAND gate ND.

The second depletion mode transistor NHD2 may limit (and/or prevent) the high voltage Vpp of the block wordline BWL from being rapidly discharged during a discharge operation.

Next, a description will be made with respect to a procedure of electrically connecting the pull-down circuit 122 from the block wordline BWL in response to the high-level output signal of the NAND gate ND. When the high-level output signal of the NAND gate ND is input, the inverter INV output a low-level signal and receives the high-level output signal of the NAND gate ND to output a low-level signal. The second low-voltage PMOS transistor PL2 is turned on in response to the low-level signal output from the inverter INV. The power supply voltage Vdd may be applied to a gate of the third high-voltage NMOS transistor NH3 according to the turned-on second low-voltage PMOS transistor PL2. Thus, the third high-voltage NMOS transistor NH3 may be turned on. For this reason, a negative voltage Vneg may be applied to the blocking node NFD. The negative voltage Vneg of the blocking node NFD may be applied to the block wordline BWL through the second depletion mode transistor NHD2.

If a voltage of the block wordline BWL is 0 volt, the negative voltage Vneg of the blocking node NFD is applied to the block wordline BWL by the second depletion mode transistor NHD2. If the voltage of the block wordline BWL is the high voltage Vpp, the second depletion mode transistor NHD2 discharges the high voltage Vpp of the block wordline BWL. As a result, the voltage of the block wordline BWL may become the negative voltage Vneg.

The voltage transfer circuit 123 connects select lines Si to Sn, string select lines SS1 to SSm, and a ground line GS to wordlines WL1 to WLn, string select lines SSL1 to SSLm, and a ground select line GSL in response to the high voltage Vpp applied to the block wordline BWL, respectively.

The voltage transfer circuit 123 may include a plurality of block select transistors. All gates of the block select transistors may be connected to the block wordline BWL. A well of the block select transistors may be implemented to be applied with the negative voltage Vneg.

The first and second low-voltage PMOS transistors PL1 and PL2 and the first to fourth high-voltage NMOS transistors NH1, NH2, NH3, and NH4 may constitute a level shifter 124.

The nonvolatile memory device according to example embodiments of inventive concepts may supply a negative voltage Vneg to a ground line GS during a program operation. The nonvolatile memory device 100 may supply the negative voltage Vneg to a selected one of the string lines SS1 to SSm. The negative voltage Vneg may include the first and second negative voltages Vneg1 and Vneg2 explained in FIGS. 11 to 17. However, the negative voltage Vneg is not limited thereto.

Figure 19:
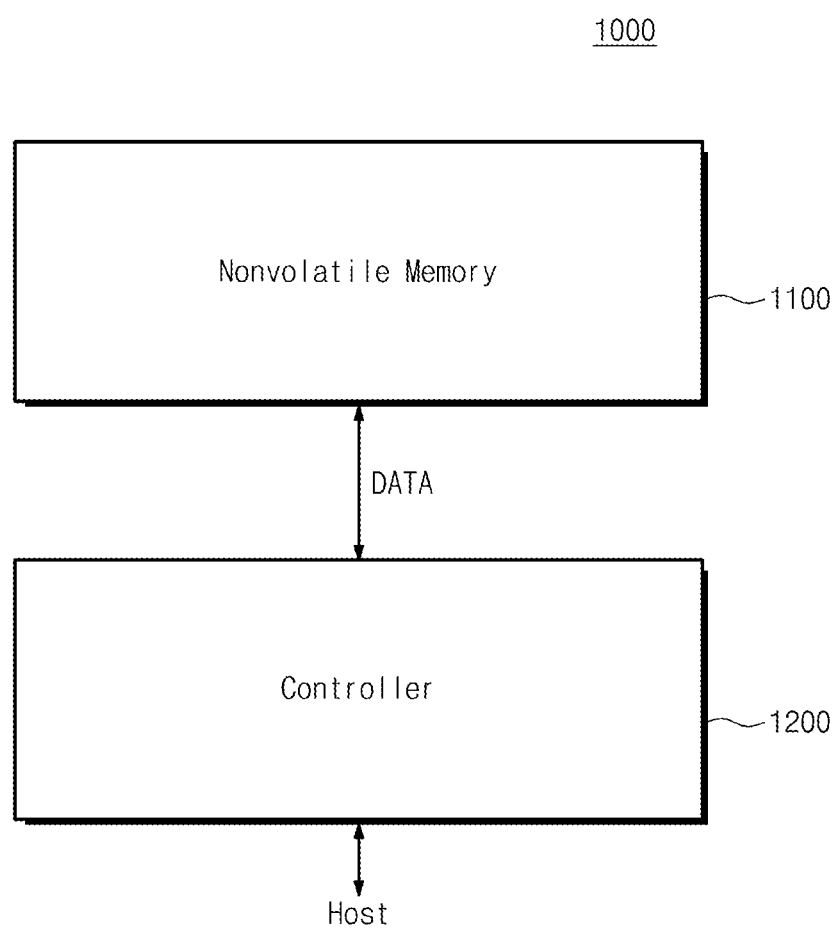
FIG. 19 is a block diagram of a memory system according to example embodiments of inventive concepts.

FIG. 19 is a block diagram of a memory system 1000 according to example embodiments of inventive concepts. As illustrated, the memory system 1000 includes a nonvolatile memory device 1100 and a controller 1200.

The nonvolatile memory device 1100 may be the nonvolatile memory device 100 described with reference to FIGS. 1 to 18. As described with reference to FIGS. 1 to 18, the nonvolatile memory device 1100 may limit (and/or prevent) abnormal disturbance by applying a negative voltage to a ground select line GSL.

The controller 1200 is connected to the nonvolatile memory device 1100. The controller 1200 is configured to access the nonvolatile memory device 1100. For example, the controller 1200 is configured to control read, write, erase, and background operations of the nonvolatile memory device 1100. The controller 1200 is configured to provide interface between the nonvolatile memory device 1100 and a host. The controller 2000 is configured to drive firmware for controlling the nonvolatile memory device 1100.

In example embodiments, the controller 1200 may include elements such as a random access memory (RAM), a processing unit, a host interface, a memory interface, and an error correction unit.

The controller 1200 may communicate with an external device (e.g., host) via at least one of various communications standards such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), and a Firewire.

The controller 1200 and the nonvolatile memory device 1100 may be integrated into a single semiconductor device. In example embodiments, the controller 1200 and the nonvolatile memory device 1100 may be integrated into a single semiconductor device to constitute a solid state drive (SSD). The controller 1200 and the non-volatile memory device 1200 may be integrated into a single semiconductor device to constitute a memory card such as a PC card (PCMCIA, personal computer memory card international association), a compact flash card (CF), a smart media card (SM, SMC), a memory stick, a multimedia card (MMC, RS-MMC, MMC-micro), an SD card (SD, miniSD, microSD, SDHC), and a universal flash storage (UFS).

The controller 1200 and the nonvolatile memory device 1100 may be integrated into a single semiconductor device to constitute a solid state drive (SSD). The SSD includes a storage unit configured to store data in a semiconductor memory. In the case where the memory system 1000 is used as the SSD, the operating speed of the host connected with the memory system 1000 is dramatically improved.

As another example, the memory system 1000 may be provided as one of various elements constituting an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a three-dimensional television, a smart television, a digital audio recorder, a digital audio player, a digital picture recorder, a digital picture player, a digital video recorder, and a digital video player, a device capable of transmitting/receiving information in wireless environment, one of various electronic devices constituting a home network, an RFID device or one of various elements constituting a computing system.

In example embodiments, the nonvolatile memory device 1100 or the memory system 1000 may be mounted in various types of packages. For example, the nonvolatile memory device 1100 or the memory system 1000 may be packaged by one of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline package (TSOP), a system in package (SIP), a multi chip package (MCP), a wafer-level fabricated package (WFP), and a wafer-level processed stack package (WSP).

Figure 20:
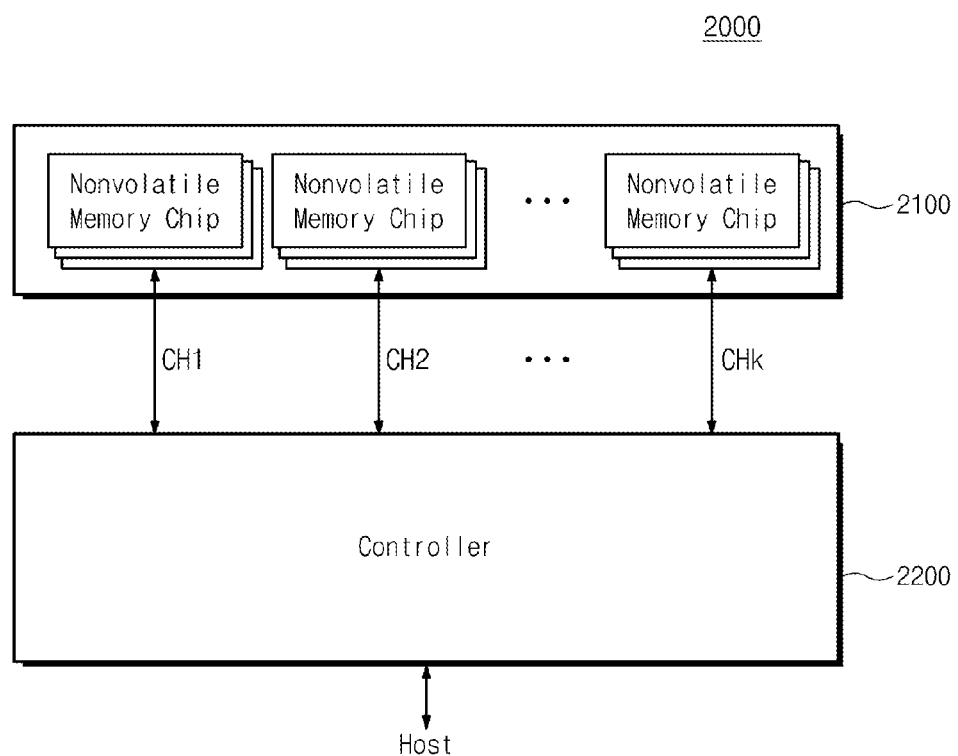
FIG. 20 is a block diagram of a memory system according to example embodiments of inventive concepts.

FIG. 20 is a block diagram of a memory system 2000 according to example embodiments of inventive concepts. As illustrated, the memory system 2000 includes a nonvolatile memory device 2100 and a controller 2200. The nonvolatile memory device 2100 includes a plurality of nonvolatile memory chips. The nonvolatile memory chips are divided into a plurality of groups. Each of the nonvolatile memory chip groups is configured to communicate with the controller 2200 through a single common channel. In example embodiments, the nonvolatile memory chips are configured to communicate with the controller 2200 through first to kth channels CH1 to CHk.

The nonvolatile memory device 2100 may be the nonvolatile memory device 100 described with reference to FIGS. 1 to 18. As described with reference to FIGS. 1 to 18, the nonvolatile memory device 2100 may limit (and/or prevent) abnormal disturbance by applying a negative voltage to a ground select line.

As shown in FIG. 20, a plurality of nonvolatile memory chips are connected to a single channel. However, the memory system 2000 may be modified such that a single nonvolatile memory chip is connected to a single channel.

Figure 21:
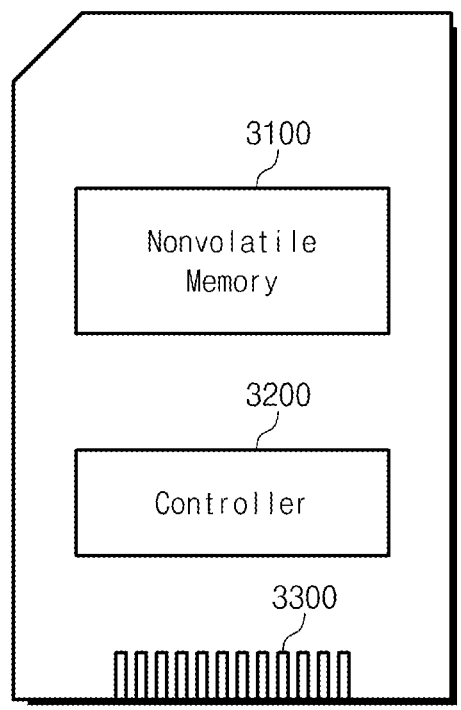
FIG. 21 is a block diagram of a memory card according to example embodiments of inventive concepts.

FIG. 21 illustrates a memory card 3000 according to example embodiments of inventive concepts. As illustrated, the memory card 3000 includes a nonvolatile memory device 3100, a controller 3200, and a connector 3300.

The nonvolatile memory device 3100 may be the nonvolatile memory device 100 described with reference to FIGS. 1 to 18. As described with reference to FIGS. 1 to 18, the nonvolatile memory device 3100 may limit (and/or prevent) abnormal disturbance by applying a negative voltage to a ground select line GSL.

The memory card 3000 may constitute memory cards such as PC card (PCMCIA), compact flash card (CF), smart media card (SM/SMC), memory stick, multimedia card (MMC, RS-MMC, MMCmicro), SD card (SD, miniSD, microSD, SDHC), and universal flash storage device (UFS).

Figure 22:
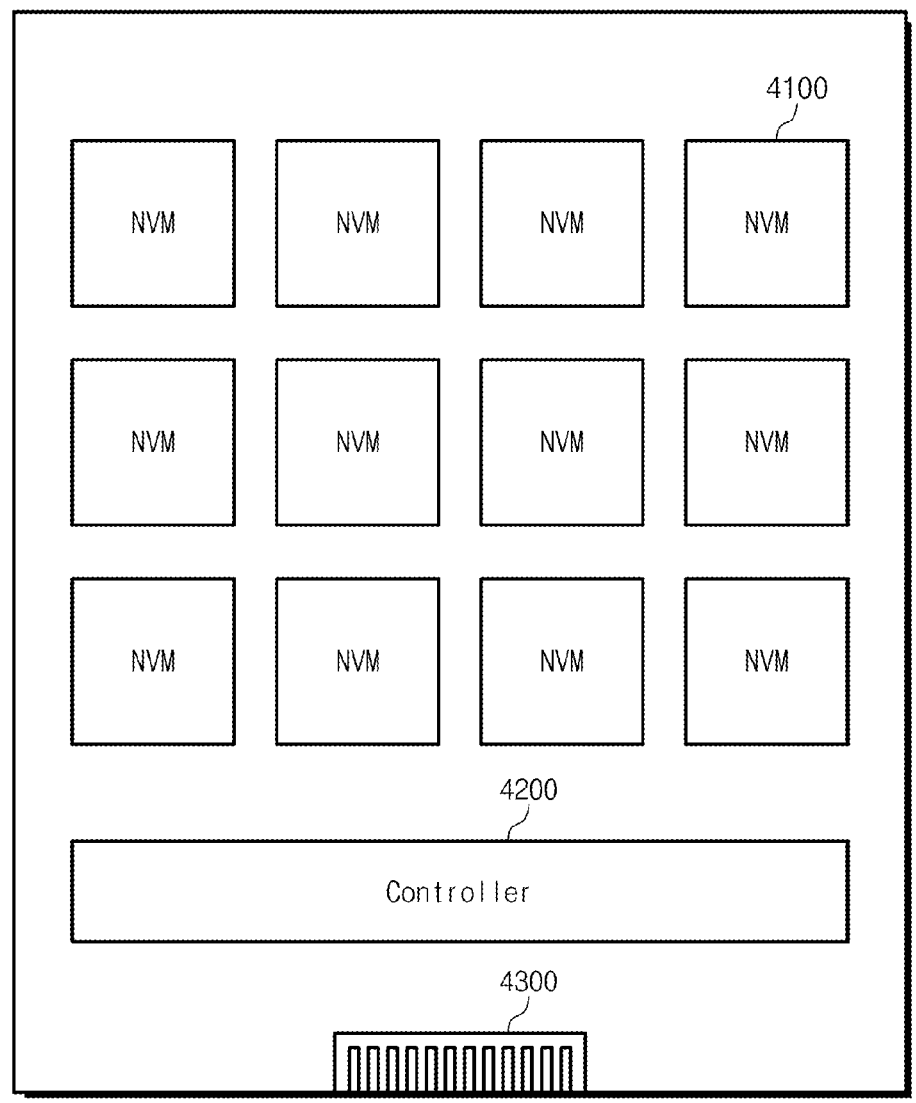
FIG. 22 is a block diagram of a solid state drive (SSD) according to example embodiments of inventive concepts.

FIG. 22 illustrates a solid state drive (SSD) 4000. As illustrated, the SSD 4000 includes a plurality of nonvolatile memory devices 4100, a controller 4200, and a connector 4300.

The nonvolatile memory device 4100 may be the nonvolatile memory device 100 described with reference to FIGS. 1 to 18. As described with reference to FIGS. 1 to 18, the nonvolatile memory device 4100 may limit (and/or prevent) abnormal disturbance by applying a negative voltage to a ground select line GSL.

The connector 4300 may electrically connect the SSD 4000 and an external device (e.g., host) to each other.

Figure 23:
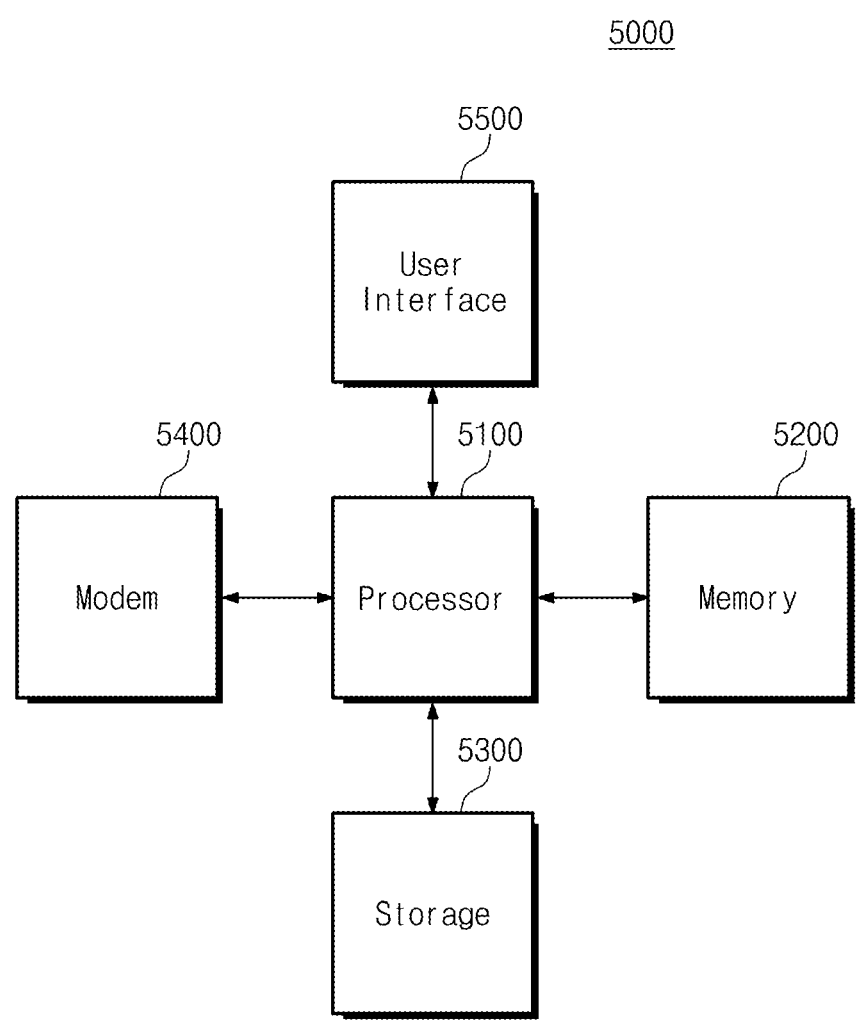
FIG. 23 is a block diagram of a computing device according to example embodiments of inventive concepts.

FIG. 23 is a block diagram of a computing device 5000 according to example embodiments of inventive concepts. As illustrated, the computing device 5000 includes a processor 5100, a memory 5200, a storage 5300, a modem 5400, and a user interface 5500.

The processor 5100 may control the overall operation of the computing device 5000 and perform a logic operation. For example, the processor 5100 may include a system-on-chip (SoC). The processor 5100 may be a universal processor or an application processor.

The memory 5200 may communicate with the processor 5100. The memory 5200 may be a working memory (or main memory) of the processor 5100 or the computing device 5000. The memory 5200 may include a volatile memory such as stack RAM (SRAM), dynamic RAM (DRAM), and synchronous DRAM (SDRAM) or a nonvolatile memory such as phase-change RAM (PRAM), magnetic RAM (MRAM), resistive RAM (RRAM), and ferroelectric RAM (FRAM).

The storage 5300 may store data that the computing device 5000 desires to stores for a long period. The storage 5300 may include a hard disk drive (HDD) or a nonvolatile memory device such as flash memory, phase-change RAM (PRAM), magnetic RAM (MRAM), resistive RAM (RRAM), and ferroelectric RAM (FRAM).

The storage 5300 may be the nonvolatile memory device 100 described with reference to FIGS. 1 to 18. As described with reference to FIGS. 1 to 18, the storage 5300 may limit (and/or prevent) abnormal disturbance by applying a negative voltage to a ground select line GSL.

In example embodiments, the memory 5200 and the storage 5300 may include the same type of a nonvolatile memory device. In this case, the memory 5200 and the storage 5300 may include a single semiconductor integrated circuit.

The modem 5400 may be configured to communicate with an external device according to the control of the processor 5100. For example, the modem 140 may perform wired or wireless communications with an external device. The modem 140 may perform communications based on at least one of wireless communication techniques or protocols such as LTE (Long Term Evolution), WiMax, GSM (Global System for Mobile communication), CDMA (Code Division Multiple Access), Bluetooth, NFC (Near Field Communication), WiFi, and RFID (Radio Frequency Identification) or wired communication techniques or protocols such as USB (Universal Serial Bus), SATA (Serial AT Attachment), SCSI (Small Computer Small Interface), Firewire, and PCI (Peripheral Component Interconnection).

The user interface 5500 may communicate with a user according to the control of the processor 5100. For example, the user interface device 5500 may include user input interfaces such as a keyboard, a keypad, a button, a touch panel, a touch screen, a touch ball, a touch pad, a camera, a gyroscope sensor, and a vibration sensor. The user interface device 5500 may include user output interfaces such as an liquid crystal display (LCD), an organic light emitting diode (OLED) display, an active matrix OLED (AMOLED) display, an LED, a speaker, and a motor.

According to example embodiments of inventive concepts, a nonvolatile memory device and a programming method thereof are provided to limit (and/or prevent) abnormal disturbance by applying a negative voltage to a ground select line during a program operation. It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A programming method of a nonvolatile memory device including a plurality of cell strings on a horizontal semiconductor layer, each of the cell strings including a plurality of memory cells stacked in a direction perpendicular to the horizontal semiconductor layer, the programming method comprising:
   setting up bitlines corresponding to the cell strings;
   setting up a plurality of string select lines connected to the cell strings, the string select lines extending in a direction intersecting the bitlines;
   applying a source line voltage to a common source line, wherein the common source line is connected to a doped region in the horizontal semiconductor layer; and
   applying a negative voltage to a ground select line connected to a plurality of ground select transistors, the negative voltage being lower than a ground voltage, the ground select transistor between the memory cells and the horizontal semiconductor layer.

2. The programming method as set forth in claim 1, wherein the applying a source line voltage to a common source line includes applying the ground voltage to the common source line, and the doped region extends in a direction parallel to the string select lines.

3. The programming method as set forth in claim 2, wherein
   an absolute value of the negative voltage is equal to an absolute value of a power supply voltage.

4. The programming method as set forth in claim 1, wherein the setting up a plurality of string select lines includes:
   applying the power supply voltage to a selected one of the string select lines; and
   applying the negative voltage to an unselected one of the string select lines.

5. The programming method as set forth in claim 1, wherein the doped region extends in a direction parallel to the string select lines.

6. The programming method as set forth in claim 5, wherein the source line voltage is higher than the ground voltage and lower than a power supply voltage.

7. The programming method as set forth in claim 6, wherein an absolute value of the negative voltage is smaller than an absolute value of the power supply voltage.

8. The programming method as set forth in claim 1, further comprising:
   applying a pass voltage to a plurality of wordlines connected to the memory cells; and
   applying a program voltage to a selected one of the wordlines after applying the pass voltage.

9. The programming method as set forth in claim 1, wherein the setting up bitlines includes:
   applying the ground voltage to a selected one of the bitlines; and
   applying a power supply voltage to an unselected one of the bitlines.

10. A nonvolatile memory device comprising:
    a memory cell array including a plurality of cell strings on a substrate, each of the cell strings including a plurality of memory cells stacked in a direction perpendicular to the substrate, a ground select transistor between the memory cells and the substrate, and a string select transistor between the memory cells and a bitline;
    an address decoder,
    the address decoder connected to the plurality of memory cells of the cell strings through wordlines,
    the address decoder connected to the string select transistors of the cell strings through string select lines, and
    the address decoder connected to the ground select transistors of the cell strings through a ground select line; and
    a control logic configured to control the address decoder to apply a negative voltage to the ground select line during a program operation, the negative voltage being lower than a ground voltage.

11. The nonvolatile memory device as set forth in claim 10, wherein the control logic is configured to control the address decoder to apply the ground voltage to a common source line during the program operation, and the common source line is connected to a doped region in the substrate, and the doped region extends in a direction parallel to the string select line.

12. The nonvolatile memory device as set forth in claim 11, wherein the control logic is configured to control the address decoder to apply a source line voltage to a common source line during the program operation, the common source line is connected to a doped region in the substrate, and the doped region extends in a direction parallel to the string select line.

13. The nonvolatile memory device as set forth in claim 11, further comprising:

a voltage generator connected to the address decoder, wherein the voltage generator is configured to generate a first negative voltage or a second negative voltage, an absolute value of the first negative voltage is the same as an absolute value of a power supply voltage, and an absolute value of the second negative voltage is less than the absolute value than the power supply voltage.

14. The nonvolatile memory device as set forth in claim 13, wherein the control logic is configured to control the address decoder to apply the first negative voltage to an unselected one of the string select lines during the program operation when the first negative voltage is applied to the ground select line.

15. The nonvolatile memory device as set forth in claim 13, wherein the control logic is configured to control the address decoder to apply the second negative voltage to an unselected one of the string select lines during the program operation when the second negative voltage is applied to the ground select line.

16. A programming method of a nonvolatile memory device including a plurality of cell strings on a substrate, each of the cell strings including a plurality of memory cells, the programming method comprising:

setting up a bit line connected to a selected cell string and an unselected cell string among the plurality of cell strings;

setting up a selected string select line and an unselected string select line, the selected string select line connected to the selected cell string, the unselected cell string connected to the unselected cell string; and applying a negative voltage to a ground select line connected to the selected cell string and the unselected cell string, the negative voltage being lower than a ground voltage.

17. The programming method of claim 16, wherein the nonvolatile memory device includes a plurality of word lines and a common source line connected to the cell strings, the plurality of memory cells in each of the plurality of cell strings are stacked on top of each other between a ground select transistor and a string select transistor, and the string select transistors of the cell strings are on top of the plurality of memory cells of the cell strings.

18. The programming method of claim 17, further comprising:

applying the ground voltage to the common source line;

applying a pass voltage to unselected word lines among the plurality of word lines; and applying a program voltage to a selected word line among the plurality of word lines.

19. The programming method of claim 17, further comprising:

applying a power supply voltage to an unselected bit line when the setting up the bit line is performed, wherein the unselected bit line is connected to other cell strings among the plurality of cell strings, the setting up the bit line connected to the selected cell string and the unselected cell string includes applying the ground voltage to the selected bit line, and the power supply voltage and the negative voltage are opposite in sign.

20. The programming method of claim 17, wherein the setting up the selected string select line and the unselected string select line includes applying a power supply voltage to the selected string select line and applying a voltage less than or equal to the ground voltage to the unselected string select line, and the power supply voltage and the negative voltage are opposite in sign.

21. The method of claim 1, wherein the plurality of cell strings and the horizontal semiconductor layer are on top of a logic structure.

22. The nonvolatile memory device of claim 10, further comprising:

a logic structure between the memory cell array and the substrate.

23. The method of claim 16, wherein the plurality of cell strings are on top of a logic structure between the substrate and the plurality of cell strings.

* * * * *